United States Patent
Ross

(10) Patent No.: US 11,246,241 B1
(45) Date of Patent: Feb. 8, 2022

(54) MOVABLE MEDIA AIR HANDLING UNIT

(71) Applicant: Amazon Technologies, Inc., Seattle, WA (US)

(72) Inventor: Peter Ross, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/809,269

(22) Filed: Mar. 4, 2020

(51) Int. Cl.
*H05K 7/20* (2006.01)
*G06F 1/20* (2006.01)
*F24F 13/10* (2006.01)
*F24F 1/0063* (2019.01)
*F24F 140/40* (2018.01)

(52) U.S. Cl.
CPC ....... *H05K 7/20736* (2013.01); *F24F 1/0063* (2019.02); *F24F 13/10* (2013.01); *G06F 1/20* (2013.01); *H05K 7/20145* (2013.01); *F24F 2140/40* (2018.01); *F24F 2221/36* (2013.01); *H05K 7/20836* (2013.01)

(58) Field of Classification Search
CPC ........................................................ G06F 1/20
USPC ........................................................ 454/184
See application file for complete search history.

(56) References Cited

U.S. PATENT DOCUMENTS

| | | | | |
|---|---|---|---|---|
| 5,701,949 A * | 12/1997 | Yamaguchi | ........ | B60H 1/00664 137/872 |
| 5,931,227 A * | 8/1999 | Graves | ................. | F24F 3/0442 165/216 |
| 6,368,206 B1 * | 4/2002 | Hunter | ................. | B08B 15/023 312/209 |
| 7,646,603 B2 * | 1/2010 | Bard | ................. | H05K 7/20754 361/696 |
| 8,113,268 B2 * | 2/2012 | Stevenson | .......... | B60H 1/00835 165/42 |
| 8,141,374 B2 * | 3/2012 | Hay | ..................... | F24F 1/0007 62/175 |
| 9,101,080 B2 | 8/2015 | Czamara et al. | | |
| 9,476,657 B1 * | 10/2016 | Pettis | ..................... | F28F 27/02 |
| 9,524,005 B2 * | 12/2016 | Saez | ................. | H05K 7/20736 |
| 9,723,762 B1 * | 8/2017 | Ross | ................. | H05K 7/20745 |
| 10,271,462 B1 | 4/2019 | Ross et al. | | |
| 10,356,949 B2 * | 7/2019 | Pan | ..................... | H05K 7/20327 |
| 2006/0042778 A1 * | 3/2006 | Stevenson | .......... | B60H 1/00835 165/41 |
| 2007/0213000 A1 * | 9/2007 | Day | ................. | H05K 7/20745 454/184 |
| 2007/0235161 A1 * | 10/2007 | Barger | ................. | F25B 41/00 165/65 |
| 2009/0061755 A1 * | 3/2009 | Calder | .............. | H05K 7/20736 454/184 |
| 2009/0260385 A1 * | 10/2009 | Hill | ......................... | E03B 3/28 62/291 |

(Continued)

*Primary Examiner* — Vivek K Shirsat
*Assistant Examiner* — Ko-Wei Lin
(74) *Attorney, Agent, or Firm* — Robert C. Koweït; Kowert, Hood, Munyon, Rankin & Goetzel, P.C.

(57) ABSTRACT

A movable media air handling unit includes cooling media panels that may be moved into or out of an airflow based on whether or not additional cooling is required from the movable cooling media panels. Moving the cooing media panels out of the air flow reduces flow restrictions/pressure drop through the movable media air handling unit. In some embodiments, various types of movable cooling media panels may be used, such as liquid coolant coil panels, gaseous coolant coil panels, evaporative cooling panels, or other types of panels.

20 Claims, 14 Drawing Sheets

(56) References Cited

U.S. PATENT DOCUMENTS

| | | | |
|---|---|---|---|
| 2011/0308766 A1* | 12/2011 | DeAngelis | F24F 3/044 165/59 |
| 2014/0071621 A1* | 3/2014 | Dong | H05K 7/20581 361/692 |
| 2014/0133099 A1* | 5/2014 | Campbell | H05K 7/20818 361/698 |
| 2014/0146459 A1* | 5/2014 | Hazzard | G06F 1/16 361/679.21 |
| 2014/0259966 A1* | 9/2014 | Totani | H05K 7/20709 52/1 |
| 2014/0298839 A1* | 10/2014 | Nagamatsu | H05K 7/20209 62/186 |
| 2014/0345238 A1* | 11/2014 | Jun | B01D 46/0004 55/385.4 |
| 2014/0355201 A1* | 12/2014 | Alshinnawi | H05K 7/20745 361/679.47 |
| 2014/0362520 A1* | 12/2014 | Alshinnawi | G06F 1/206 361/679.47 |
| 2015/0072607 A1* | 3/2015 | Hicks | H05K 7/20909 454/184 |
| 2015/0099452 A1* | 4/2015 | Mazzocco | B60H 1/00678 454/266 |
| 2015/0111487 A1* | 4/2015 | Son | F24F 3/044 454/329 |
| 2015/0181770 A1* | 6/2015 | Keisling | F21V 33/0092 454/184 |
| 2016/0302326 A1* | 10/2016 | Chen | H05K 7/20618 |
| 2017/0227242 A1* | 8/2017 | Kimura | H05K 7/20318 |
| 2017/0347496 A1* | 11/2017 | Smith | B03C 3/47 |
| 2018/0100671 A1* | 4/2018 | Snider | F24F 13/30 |
| 2019/0172622 A1* | 6/2019 | Takauchi | H01F 27/2876 |
| 2020/0163256 A1* | 5/2020 | Chehade | H05K 7/1488 |
| 2020/0284480 A1* | 9/2020 | Tolouei Asbforoushani | F24F 1/42 |

* cited by examiner

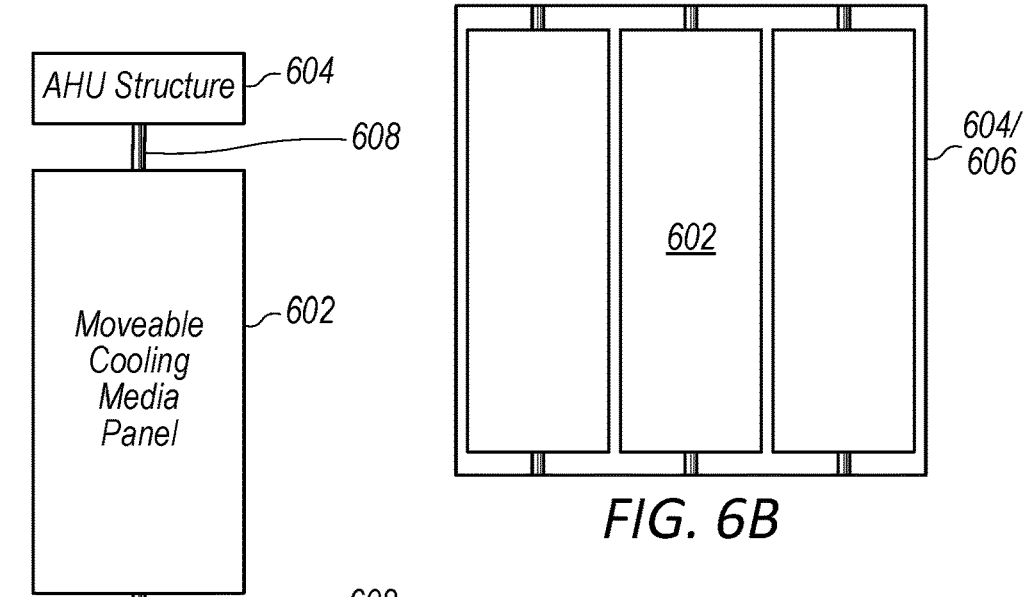
FIG. 6A
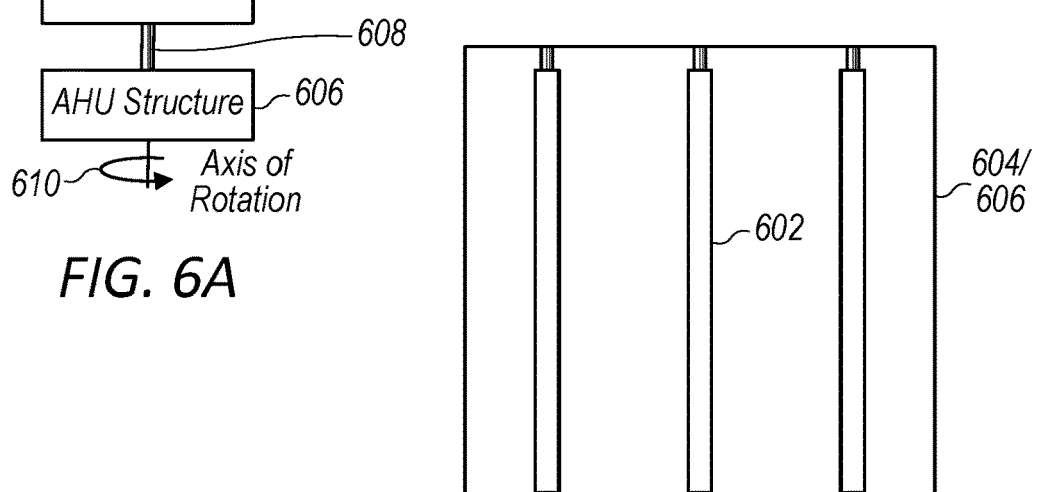
FIG. 6B
FIG. 6C
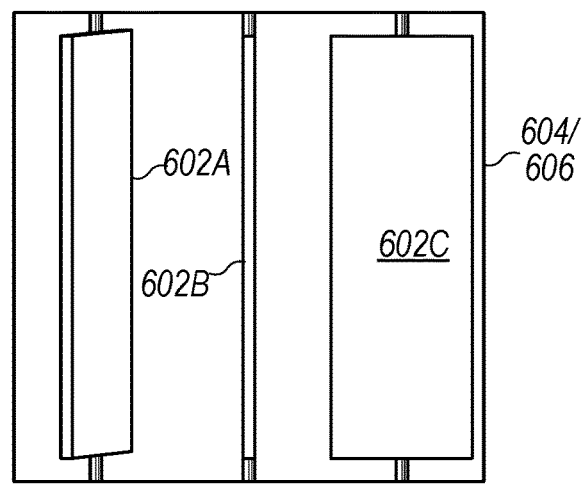
FIG. 6D

MOVABLE MEDIA AIR HANDLING UNIT

BACKGROUND

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems organized into a plurality of computing rooms. Some known data centers include methods and apparatus that facilitate waste heat removal from a plurality of rack systems, typically by circulating conditioned air through one or more of the rack systems.

Additionally, many data centers rely on air handling systems to maintain the temperatures and other environmental conditions of air used to cool rack systems within acceptable limits. In some cases, such air handling systems may not be designed to take advantage of variable ambient conditions at a data center location, such as using outside air to cool portions of a data center when ambient conditions permit. Also, some air handling systems that do allow for use of ambient outside air to cool portions of a data center may include air handling systems that inefficiently move outside air through the air handling system. These inefficiencies may result in higher operating costs, such as for power used to operate fans or blowers in the air handling system.

BRIEF DESCRIPTION OF THE DRAWINGS

FIG. 6A illustrates a block diagram of a movable cooling media panel coupled to a structure of an air handling unit, wherein the movable cooling media panel is configured to rotate about an axis of rotation through a center or interior portion of the movable cooling media panel, according to some embodiments.

FIG. 6B illustrates a block diagram of a cutaway view of an air passage of a movable media air handling unit comprising a set of movable cooling media panels configured for center rotation, wherein the set of movable cooling media panels are positioned in a closed position, according to some embodiments.

FIG. 6C illustrates a block diagram of a cutaway view of an air passage of a movable media air handling unit comprising a set of movable cooling media panels configured for center rotation, wherein the set of movable cooling media panels are positioned in an open position, according to some embodiments.

FIG. 6D illustrates a block diagram of a cutaway view of an air passage of a movable media air handling unit comprising a set of movable cooling media panels configured for center rotation, wherein different ones of the movable cooling media panels are independently controlled and positioned in different positions, according to some embodiments.

Figure 1A:
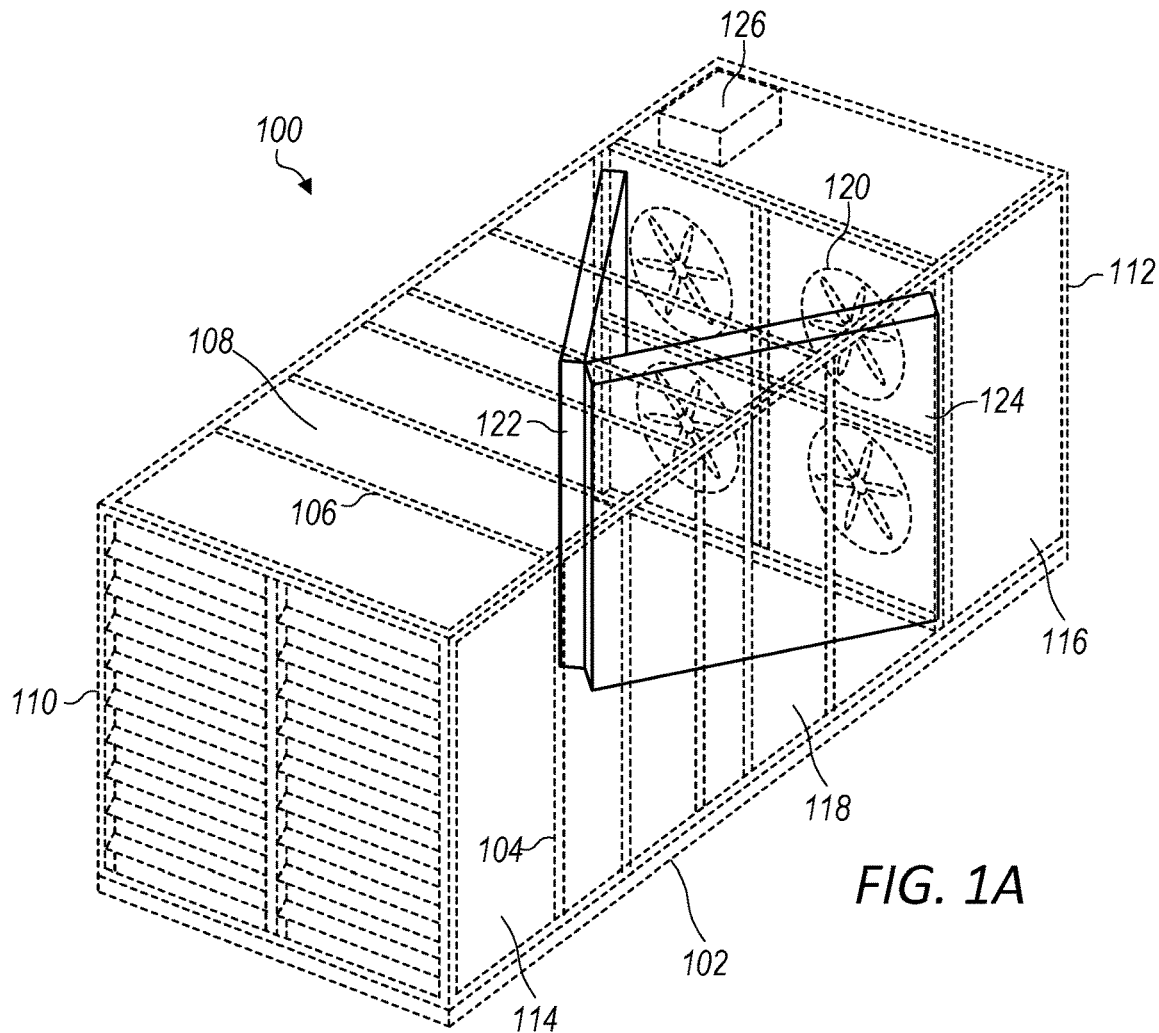
FIG. 1A illustrates a perspective view of a movable media air handling unit that includes movable cooling media panels in an air passage of the air handling unit, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

A movable media air handling unit and systems and methods for operating a moveable media air handling unit are described herein.

According to one embodiment, a data center includes rack-mounted computer systems mounted in respective computer rooms of the data center and a moveable media air handling unit configured to supply cooling air to the computer rooms. The movable media air handling unit comprises a frame structure that forms an air passage through the moveable media air handling unit. In some embodiments, the frame structure may include horizontal and vertical frame members along with flat plates, such as sheet metal plates, that enclose the air passage. The moveable media air handling unit also includes fans configured to induce air flow through the air passage and one or more moveable cooling media panels coupled to the frame structure between an inlet end and an outlet end of the air passage. The one or more moveable cooling media panels are coupled to the frame structure such that the one or more movable cooling media panels are configured to be moved in the air passage between a closed position and an open position. In the closed position, the one or more moveable cooling media panels are positioned in the air passage such that the induced air flow through the air passage flows through the one or more movable cooling media panels. In the open position, the one or more movable cooling media panels are positioned in the air passage such that at least a portion of the induced air flow through the air passage flows through the air passage without flowing through the one or more movable cooling media panels.

For example, the one or more movable cooling media panels may be moved out of a path of the air flow through the air passage. Thus, when in the open position, the one or more movable cooling media panels may enable air to flow directly through the air passage without being presented with pressure losses and/or flow restrictions that would occur due to the air being re-directed into an alternative path, such as a bypass plenum, that bypasses the one or more movable cooling media panels. Also pressure losses and/or flow restrictions associated with flowing the air through the one or more movable cooling media panels without coolant applied to the panels may be avoided. For example, by moving the one or more movable cooling media panels out of the flow path through the air passage both less pressure drop and fewer restrictions to flow may be achieved than would be the case when the moveable cooling media panels are in the closed position (e.g. in the air path) and being used to cool air in the air path. These reductions in pressure drop and/or flow restrictions may enable a similar discharge flow rate or discharge air pressure of air supplied from the movable media air handling unit to be achieved while using less electricity to drive the fans, than would be the case if the air was re-routed into a bypass plenum or allowed to flow through the cooling media panels without coolant applied.

According to one embodiment, a movable media air handling unit includes a structure forming an air passage through the movable media air handing unit, one or more fans configured to induce air flow through the air passage, and a movable cooling media panel coupled to a structure of the air handling unit between an inlet end of the air passage and an outlet end of the air passage. The movable cooling media panel is coupled to the structure of the movable media air handling unit such that the movable cooling media panel is configured to be moved in the air passage between two or more positions, including at least a first position and a second position. In the first position, the movable cooling media panel is positioned in the air passage such that the induced air flow through the air passage flows through the movable cooling media panel. In the second position, the movable cooling media panel is positioned in the air passage such that at least a portion of the induced air flow through the air passage flows through the air passage without flowing through the movable cooling media panel.

According to one embodiment, one or more computer readable storage media store program instructions that when executed on or across one or more computing devices cause the one or more computing devices to implement a controller for a movable media air handling unit. The controller is configured to determine a position adjustment of a movable cooling media panel of the movable media air handling unit and cause the movable cooling media panel of the movable media air handling unit to be adjusted in an air passage of the moveable media air handling unit between a closed position and an open position based on the determined position adjustment.

As used herein, an "aisle" means a space next to one or more racks, such as standard racks hosting rack-mounted computer systems.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "evaporative cooling" means cooling of air by evaporation of a liquid.

As used herein, "free cooling" includes a mode of operation in which an air handling system pulls air at least partially from an external source (such as air outside a facility) and forces the air to pass through electronic equipment without active chilling in the air-handling system (e.g., without passing over chiller coils through which a coolant circulates or without passing through an evaporative cooler).

As used herein, "rack computing systems" means a computing system that includes one or more computing devices mounted in a rack.

As used herein, "room" means a room or a space of a building. As used herein, "computer room" means a room of a building in which computing devices, such as rack-mounted servers, are operated.

As used herein, a "space" means a space, area or volume.

Some facilities, such as data centers, utilize air handling systems to provide cooling air to the facilities. The air handling systems may recirculate air from the facility and/or draw in fresh air from an outside environment that is mixed with the recirculated air. The recirculated air and/or fresh air is passed through a cooling section of the air handling system, wherein the air flows over cooling media, such as cooling coils. Some such air handling systems may include a bypass duct that allows recirculated/fresh/mixed air to bypass the cooling section. Alternatively, some such air handling systems may operate in a mode in which coolant flow is disabled to the cooling coils. In air handling systems that include a bypass duct, the inclusion of the bypass duct may introduce flow restrictions that cause pressure drops in the air flow that is re-routed through the bypass duct. For example, louvers that re-direct air into a bypass duct may restrict flow and cause pressure drops. Also, typical bypass ducts have a smaller cross-sectional area than a cooling section, which adds additional flow restrictions and pressure drops to air re-routed through the bypass ducts. Additionally, including a bypass duct in an air handling system may consume a portion of a volume of the air handling system that could otherwise be allotted to a cooling section. For example, if a bypass duct is not included in the air handling system, the cooling section of the air handling system may have a greater cross sectional area that results in less flow restriction and less pressure drop, than would be the case if a bypass duct was included.

In some embodiments, a moveable media air handling unit includes movable cooling media panels that can be moved into or out of an air flow through an air passage of the movable media air handling system. By moving the cooling media panels out of the air flow through the air passage, flow restrictions and pressure drops that would otherwise occur in a bypass duct may be avoided. Also, a larger portion of the air handling unit may be allocated to the air passage because space in the air handling unit does not need to be used for a bypass duct. This may lead to an air passage with a larger cross sectional area for an air handling unit with a given volume than would be the case if a bypass duct was included. Additionally, moving the cooling media panels out of the air flow through the air passage may reduce flow restrictions through the air passage and increase fan efficiency of the air handling unit when the movable cooling media panels are in an open position.

In some embodiments, various movable cooling media panel arrangements may be used, such as two movable cooling panels that form a "V" shaped bank in a closed position and that rotate out of the air passage when in an open position. In some embodiments, additional movable cooling media panels may be used and may form a "W" shaped bank. In some embodiments, movable cooling media panels may be coupled together or to a frame structure of a movable media air handling unit via hinges mounted on edges of the movable cooling media panels. In some embodiments, movable cooling media panels may be coupled to a frame structure of a movable media air handling unit via connectors that connect to a center portion of the movable cooling media panels, wherein the connectors enable the movable cooling media panels to rotate in place in the air passage. For example, a movable cooling media panel may be rotated such that a face of the panel is in oriented such that air flow in the air passage flows through the movable cooling media panel. Alternatively the movable cooling media panel may be rotated such that the face of the movable cooling media panel is oriented parallel to the air flow through the air passage, such that the air flows around the movable cooling media panel without flowing through the movable cooling media panel.

In some embodiments, a movable media air handling unit may include a process logic controller (PLC) or other computing device that includes one or more memory that store program instructions, that when executed on one or more processors implement a controller for the movable media air handling unit. The controller may be configured to receive set point information from a building management system of a facility that includes the movable media air handling unit, such as a data center location at which the movable media air handling unit is located. Additionally or alternatively, the controller may be programmed with particular set points or may include a user interface that enables set point adjustment. In some embodiments, a controller for a movable media air handling system may be configured to receive and control to an output temperature set point, an output humidity set point, an output flow rate, and/or an output plenum pressure. In some embodiments, other set points may be used.

In some embodiments, a controller for a movable media air handling unit may be configured to receive various inputs, such as temperatures at different locations in a facility, humidity in different locations in a facility, output temperature of output air from the movable media air handling unit, output humidity of output air from the movable media air handling unit, ambient (e.g. outside) air temperature, ambient humidity, ambient air particulate count, etc. Additionally, the controller may be configured to receive output pressure and/or output flow measurements of output air from the movable media air handling unit, and may also receive pressure and/or flow measurement at other locations in an air distribution system, such as at branches off of a main air supply plenum, etc. Based on the received data, measurements and/or set points, the controller may determine whether to operate the movable media air handling unit in a first mode wherein air is passed through the movable cooling media panels, or may determine to operate the movable media air handling unit in a second mode wherein the movable cooling media panels are moved out of an air flow and not used to cool air flowing through the movable media air handling unit. In some embodiments, the controller may further determine to operate the movable media air handling unit in any of a plurality of intermediate modes, wherein the movable cooling media panels are partially open or partially closed.

For example, if ambient air conditions are acceptable, such as moderate temperature and humidity with acceptable particulate count, the movable media air handling unit may determine that temperature and humidity set points for output air can be achieved without using the movable cooling media panels to further condition the ambient air. In such cases, the controller may cause an actuator of the movable media air handling unit to cause the movable cooling media panels to move out of the air flow path through the movable media air handling unit. As mentioned above, this may reduce flow restrictions and/or pressure drop through the movable media air handling unit and may result in greater fan efficiencies. Conversely, if ambient conditions are not acceptable (e.g. high temperature, high humidity, high particulate count, etc.) the controller may cause the actuators to cause the movable cooling media panels to be moved into a closed position such that air flowing through the air passage of the movable media air handling unit flows through the movable cooling media panels and is conditioned by the movable cooling media panels. In some embodiments, a controller may cause the movable cooling media panels to be positioned in various intermediate positions between a fully closed position and a fully open position. Additionally, the controller may adjust fan speeds, coolant flow rates, evaporative cooling panel utilization, etc. to control the output air to the indicated set points. In some embodiments, in addition to or in place of determining whether or not to operate the movable cooling media panels in an open or closed position based on ambient outside air conditions, internal air conditions such as recirculated air temperature and humidity may be used.

Also, in some embodiments a movable media air handling unit may include a modular structure that can be quickly and simply adapted to a particular environment in which the movable media air handling unit is to be deployed. For example, a movable media air handling unit may include an air passage with quick connecting hinges or other connectors for accepting any one of a plurality of different types of movable cooling media panels, such as chilled liquid based movable cooling media panels, compressed refrigerant based movable cooling media panels, evaporative cooling based movable cooling media panels, etc. Additionally, a modular movable media air handling unit may be pre-fabricated with a plurality of different types of coolant connectors for coupling with the different types of movable cooling media panels. For example, a modular movable media air handling unit may be pre-fabricated with a rotating connector block for connecting to a compressed refrigerant movable cooling media panel and a may also be pre-fabricated with flexible hoses for connecting a chilled liquid movable cooling media panel or an evaporative cooler movable cooling media panel. In this way, any one of the various types of movable cooling media panels may be interchangeably installed in the modular movable media air handling unit, wherein the particular type of movable cooling media panel selected is selected based on conditions at a location at which the modular movable air handling unit is deployed or to be deployed.

FIG. 1A illustrates a perspective view of a movable media air handling unit that includes movable cooling media panels in an air passage of the air handling unit, according to some embodiments.

Movable media air handling unit 100 includes frame structure 102 that includes vertical frame members 104 and horizontal frame members 106. Additionally, frame structure 102 includes plates 108 that enclose an interior of the movable media air handling unit 100. Movable media air handling unit 100 also includes an inlet end 110 and an outlet end 112. In some embodiments, a filter compartment 114 is located adjacent to the inlet end 110 and a fan compartment 116 is located adjacent to the outlet end 112. Additionally, an air passageway 118 is located between filter compartment 114 and fan compartment 116. In some embodiments, plates 108 of the frame structure 102 enclose the air passageway 118 and separate an air flow through the air passageway 118 from air external to the movable media air handling unit 100. For example, the frame structure 102 may seal the air passageway such that a pressure gradient induced by fans 120 in the fan compartment 116 causes air to be pulled into the air passageway 118 from the inlet end 110 via filters of the filter compartment 114. Also, the fans of fan compartment 116 may further pull air out of the air passageway 118 and push the air into an output supply plenum that supplies cooling air to a facility at which the movable media air handing unit 100 is located.

Movable media air handling unit 100 also includes movable cooling media panels 122 and 124 located in the air passageway 118 and coupled to frame structure 102 such that the movable cooling media panels 122 and 124 are configured to be moved into, and out of, an airflow through air passageway 118. For example, movable cooling media panels 122 and 124 are illustrated in FIG. 1A in a closed position, wherein the movable cooling media panels are positioned in the air passageway 118 such that air pulled through the air passageway 118 by fans 120 is predominately pulled through the movable cooling media panels 122 and 124. Note that there may be some leakage around the movable cooling media panels 122 and 124. However a predominant amount of the air flow through the air passage will flow through the movable cooling media panels 122 and 124 when in the closed position. As another example, as shown in FIG. 1C, the movable cooling media panels 122 and 124 may be moved into an open position wherein the movable cooling media panels 122 and 124 are out of the airflow path through air passageway 118 such that air flows from the filter compartment 114 to the fan compartment 116 and through the air passageway 118 without flowing through the movable cooling media panels 122 and 124 and without being redirected into a bypass air plenum.

Note that while various ones of the figures included herein, such as FIG. 1A, illustrate a negative pressure arrangement, wherein fans "pull" air through the air handling unit, in some embodiments, a movable media air handling unit, such as movable media air handling unit 100, may be configured with a positive pressure arrangement wherein fans "push" air through the air handling unit. For example, fans 120 may be reconfigured to push air into air passageway 118, instead of pulling air from air passageway 118. Also, in some embodiments, filter compartment 114 may be positioned upstream of fans that push air or may be omitted.

Figure 8A:
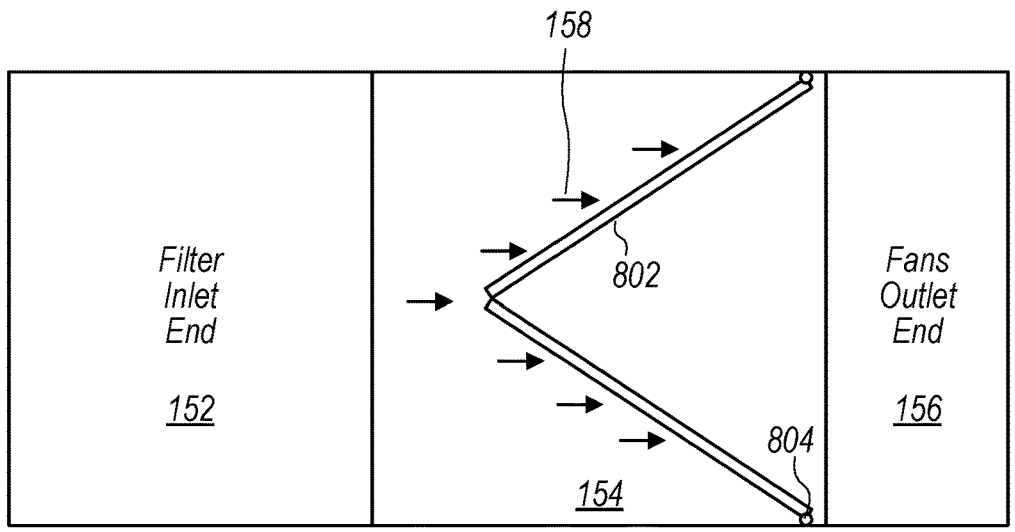
FIG. 8A illustrates a block diagram top or side view of a movable media air handling unit with movable cooling media panels arranged in a "V" shape arrangement, according to some embodiments.
Figure 8B:
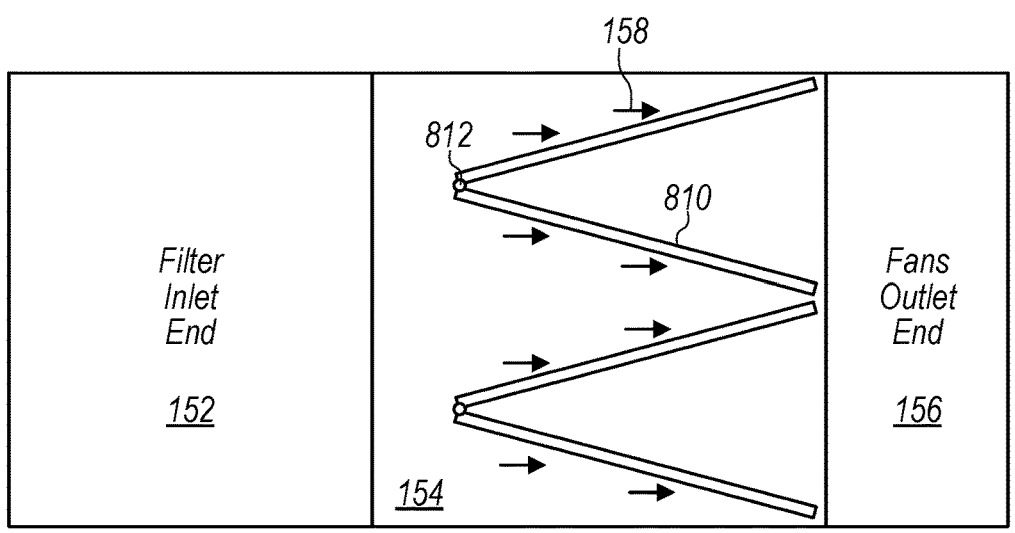
FIG. 8B illustrates a block diagram top or side view of a movable media air handling unit with movable cooling media panels arranged in a "W" shape arrangement, wherein the respective movable cooling media panels are configured for hinged side rotation, according to some embodiments.
Figure 8C:
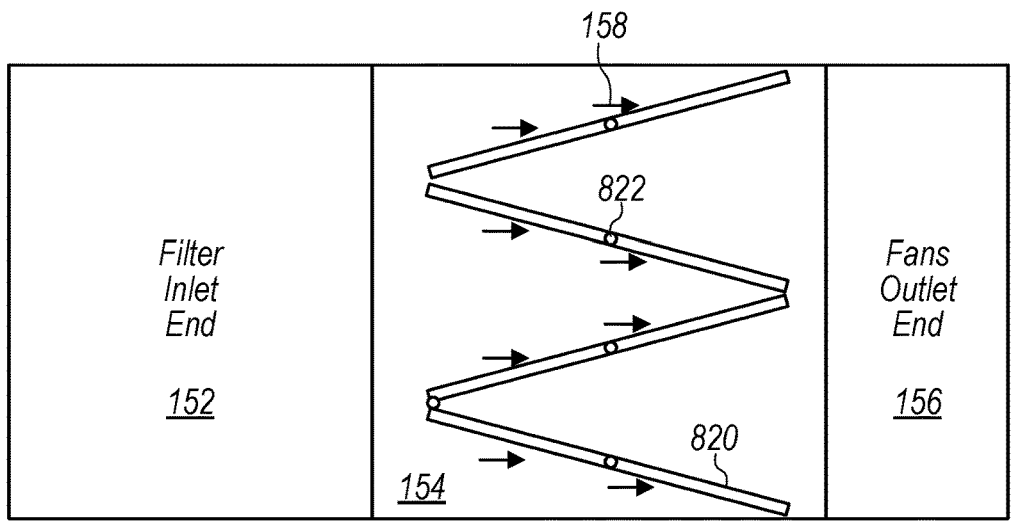
FIG. 8C illustrates another block diagram top or side view of a movable media air handling unit with movable cooling media panels arranged in a "W" shape arrangement, wherein the respective movable cooling media panels are configured for center rotation, according to some embodiments.
Figures 9A, 9B, 9C:
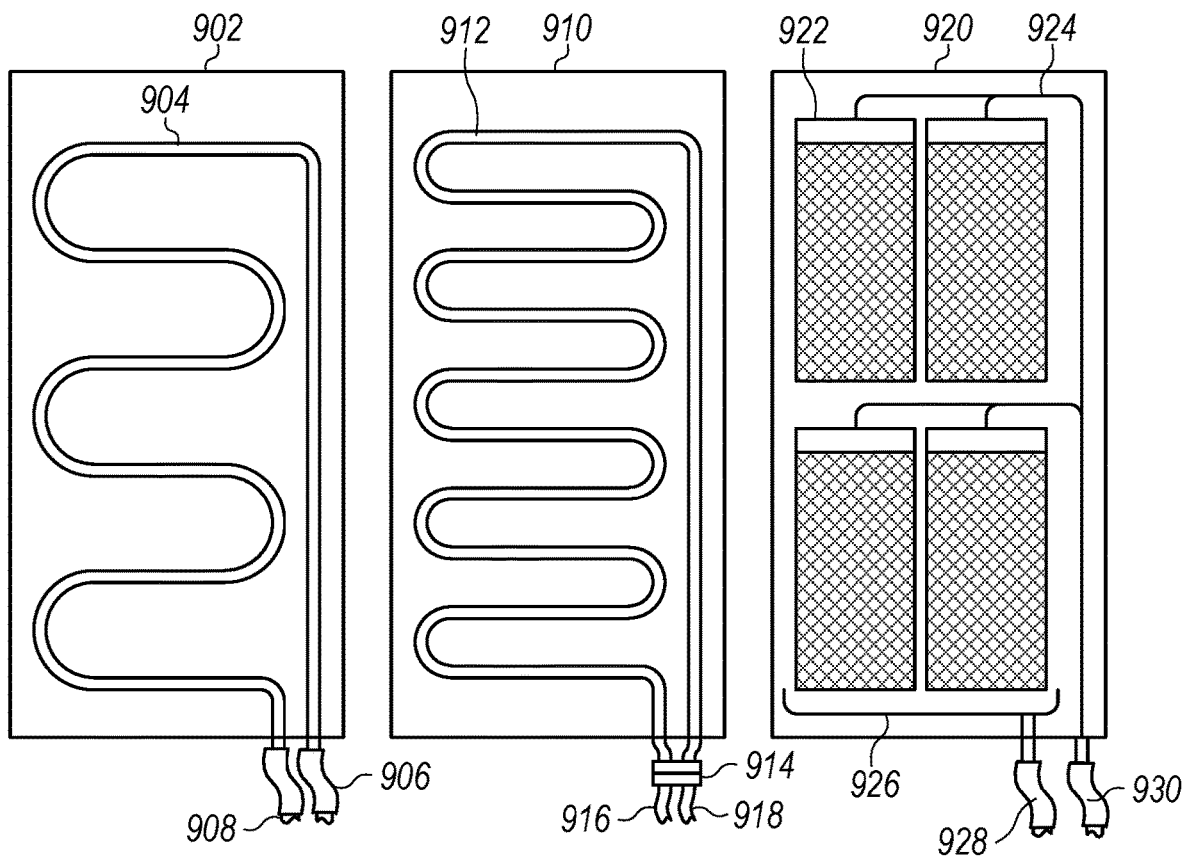
FIG. 9A illustrates an example movable cooling media panel comprising chilled liquid cooling coils and a chilled liquid flexible connection for the chilled liquid cooling coils, according to some embodiments.
FIG. 9B illustrates an example movable cooling media panel comprising compressed refrigerant cooling coils and a rotating connector block for the chilled refrigerant cooling coils, according to some embodiments.
FIG. 9C illustrates an example movable cooling media panel comprising evaporative cooling media sections and a flexible connection for supplying fluid to the evaporative cooling media sections and draining excess fluid from the evaporative cooling media sections, according to some embodiments.

Also, as discussed in more detail in FIGS. 9A-9C, various types of movable cooling media panels may be used in a movable media air handling unit, such as those comprising chilled liquid cooling coils, compressed refrigerant cooling coils, and/or evaporative cooling media banks. Also, in some embodiments, various movable cooling media panel configurations, such as "V" shape configuration, a "W" shape configuration, etc., may be used in a movable media air handling unit such as described in FIGS. 8A-8C. Additionally, in some embodiments, various methods of attaching movable cooling media panels to a frame structure of a movable media air handling unit may be used, such as those discussed in FIG. 4-7. In some embodiments, any of the various movable cooling media panel types, panel arrangements, and attachment methods described herein may be combined in various combinations and installed in an air passageway of a movable media air handling unit, such as air passageway 118 of movable media air handling unit 100.

In addition, in some embodiments, a movable media air handling unit, such as movable media air handling unit 100, may include a process logic controller (PLC) or other computing device that implements a controller for the movable media air handling unit. For example, movable media air handling unit 100 includes PLC 126. In some embodiments, a controller for a movable media air handling unit may follow one or more control schemes, such as those discussed with regard to FIG. 13.

Figure 1B:
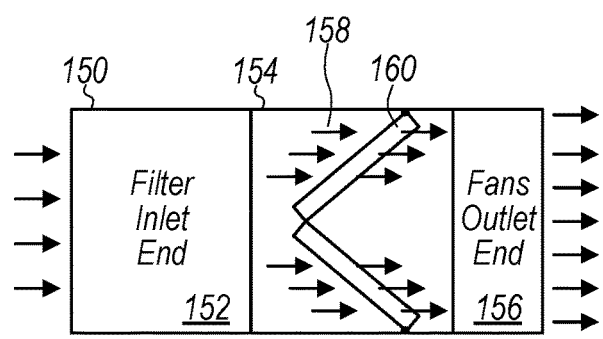
FIG. 1B illustrates a block diagram top view of a movable media air handling unit, wherein movable cooling media panels in an air passage of the air handling unit are in a closed position, according to some embodiments.
Figure 1C:
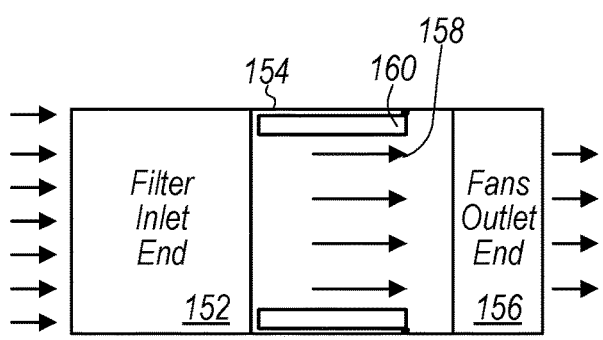
FIG. 1C illustrates a block diagram top view of a movable media air handling unit, wherein movable cooling media panels in an air passage of the air handling unit are in an open position, according to some embodiments.

FIGS. 1B-1C illustrate block diagram top views of a movable media air handling unit, wherein movable cooling media panels in an air passage of the air handling unit are in a closed position and an open position, according to some embodiments. For example, movable media air handling unit 150 illustrated in FIGS. 1B-1C may be a similar movable media air handling unit as movable media air handling unit 100 illustrated in FIG. 1A.

In FIG. 1B, movable cooling media panels 160 are adjusted to be in a closed position such that airflow 158 passing through air passageway 154 from inlet/filter end 152 passes through movable cooling media panels 160 on the way to outlet/fan end 156. Conversely, in FIG. 1C movable cooling media panels 160 are adjusted to be in an open position such that airflow 158 passing through air passageway 154 from inlet/filter end 152 passes through the air passageway 154 and on to outlet/fan end 156 without passing through movable cooling media panels 160. As discussed above, this may reduce flow restrictions and/or pressure drops experienced by airflow 158 as compared to routing the airflow 158 through a bypass plenum or through inactive cooling panels. Note that FIGS. 1B-1C illustrate a "V" shaped movable cooling media bank with edge-hinged panels. However, various other bank configurations and connector types, as described herein, may be used to mount movable cooling media panels in an air passageway such as air passageway 154. Also note that moving the movable cooling media panels 160 out of airflow path 158 (as shown in FIG. 1B) enables airflow 158 to primarily utilize the full cross sectional area of air passageway 154 while only a minimal amount of the air passageway 154 is blocked by the movable cooling media panels that have been moved out of airflow path 158.

Figure 2:
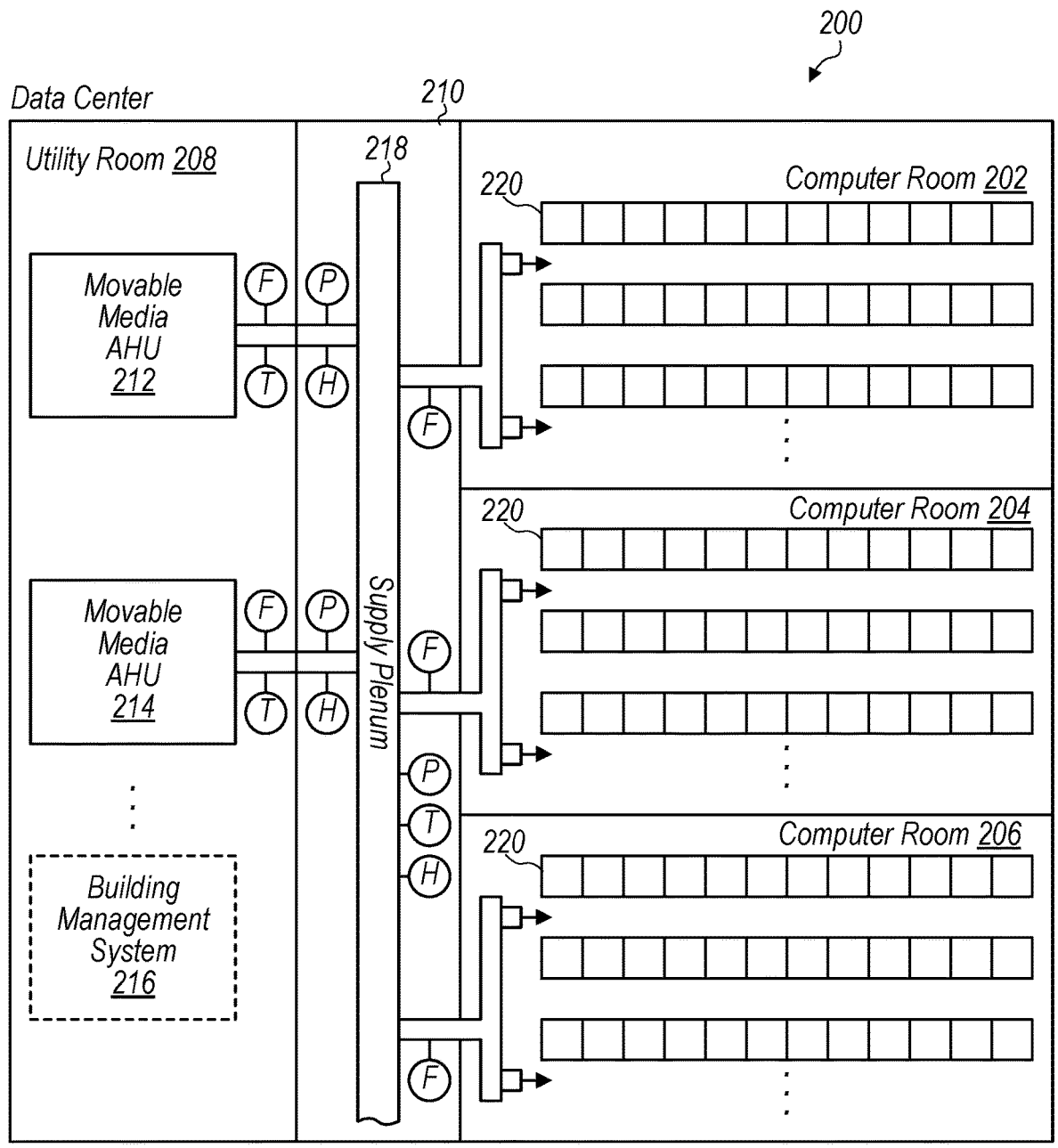
FIG. 2 illustrates a block diagram top view of a data center that includes computer rooms and moveable media air handling units configured to supply cooling air to the computer rooms, according to some embodiments.

FIG. 2 illustrates a block diagram top view of a data center that includes computer rooms and moveable media air handling units configured to supply cooling air to the computer rooms, according to some embodiments.

Data center 200 includes computer rooms 202, 204, and 206, utility room 208, and corridor 210. Computer rooms 202, 204, and 206 include rack mounted computer systems 220 mounted in racks that are organized into rows in the respective computer rooms. For example, the racks may be organized into hot aisles and cold aisles, wherein cooling air is supplied to the cold aisles from supply plenum 218 and respective branch plenums connecting the respective computer rooms to supply plenum 218.

Utility room 208 includes movable media air handling units 212 and 214. In some embodiments more movable media air handling units or fewer movable media air handling units may be included in utility room 208. In some embodiments, movable media air handling units 212 and 214 may be any of the movable media air handling units described herein, such as movable media air handling unit 100 or 150 previously described in FIGS. 1A-1C.

Corridor 210 includes cooling air supply plenum 218 that receives supply air from movable media air handling units 212 and 214 and that distributes the supply air to respective ones of computer rooms 202, 204, and 206.

In some embodiments, various sensors may be included in an air distribution system, such as supply plenum 218 and its associated branches. The various sensors may be used by a controller of a movable media air handling unit and/or a building management system of a data center, such as building management system 216, to control cooling air supply conditions. For example, in some embodiments, an outlet duct from a movable media air handling unit may include an air flow sensor "F", an air pressure sensor "P", a temperature sensor "T" and/or a humidity sensor "H" as shown in FIG. 2. Additionally, in some embodiments, other types of sensors may be used and/or the sensors may be located in different positions. Also, in some embodiments, sensors such as pressure sensor "P", temperature sensor "T" and/or humidity sensor "H" may be included in a main supply plenum, such as supply plenum 218 as shown in FIG. 2. Also in some embodiments, branch connections from the supply plenum 218 to respective ones of the computer rooms 202, 204, and 206 may include one or more sensors, such as a flow sensor "F" as shown in FIG. 2.

In some embodiments, a building management system, such as BMS 216, may directly control movable media air handling units 212 and 214. For example the BMS 216 may instruct the movable media air handling units 212 and 214 at what position to adjust a movable cooling media panel and/or the BMS 216 may instruct a fan speed to be used. In other embodiments, a BMS 216 may provide output condition set points to the movable media air handling units 212 and 214 and a local controller of the movable media air handling units may adjust a movable cooling media panel position and or fan speeds to achieve the set point received from the BMS 216.

In some embodiments, a building management system, such as BMS 216, may coordinate control across multiple movable media air handling units, such as movable media air handling units 212 and 214.

Figure 3:
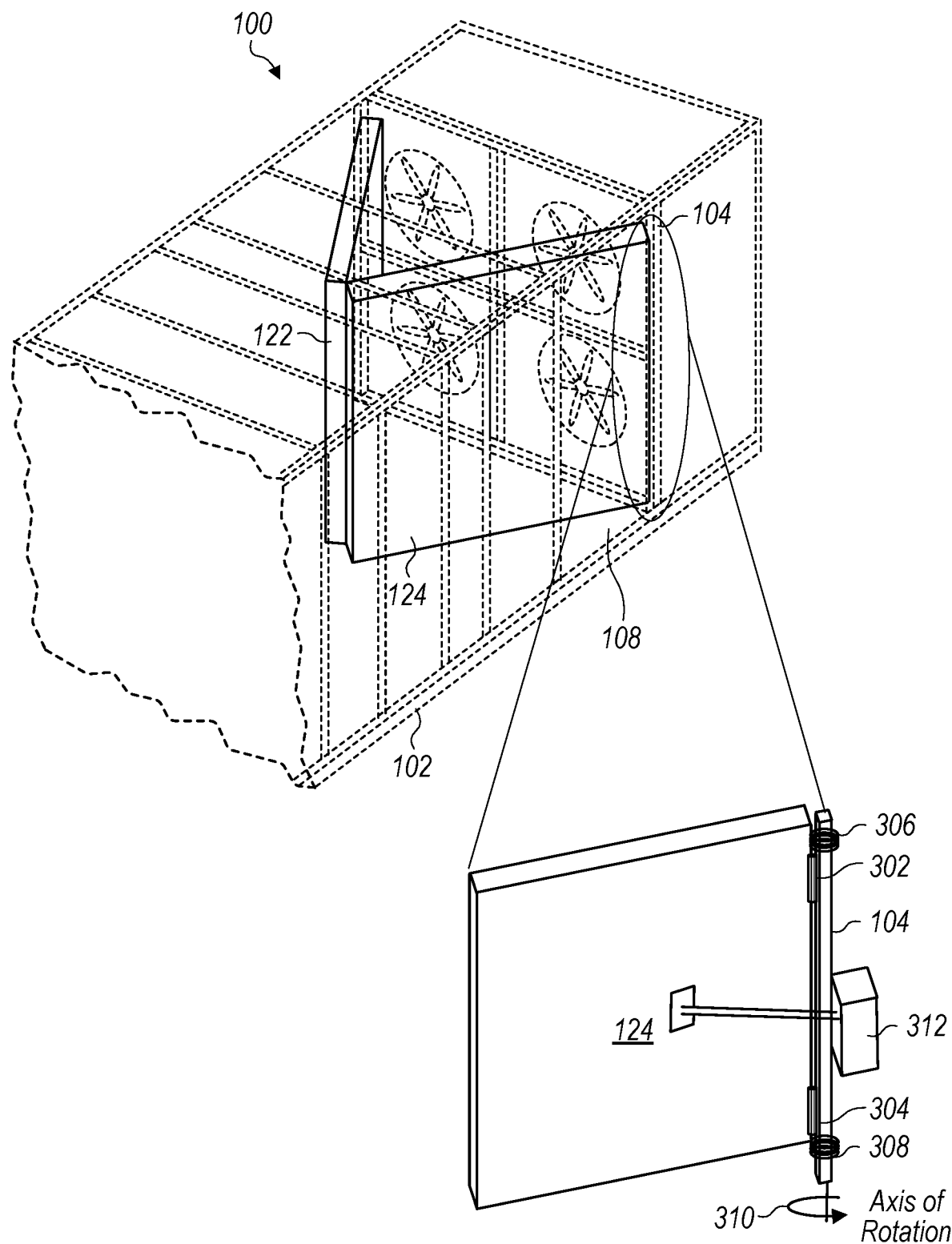
FIG. 3 illustrates a more detailed view of a hinged connection and actuator assembly for a movable cooling media panel of a moving media air handling unit, according to some embodiments.

FIG. 3 illustrates a more detailed view of a hinged connection and actuator assembly for a movable cooling media panel of a moving media air handling unit, according to some embodiments.

In some embodiments, movable cooling media panel 124 is coupled to vertical member 104 of structure 102 of the movable media air handling unit 100 via hinged connectors 302 and 304. These hinged connectors enable movable cooling media panel 124 to rotate about an axis of rotation 310 running along an edge of the movable cooling media panel 124. As described in FIG. 6, in some embodiments connectors with a centered axis of rotation may also be used, wherein a movable cooling media panel rotates about an axis of rotation running through a center portion of the panel.

In some embodiments, an assembly including springs 306 and 308 along with actuator 312 may also be coupled to the structure 102/vertical member 104 and movable cooling media panel 124. In some embodiments, springs 306 and 308 may function as a mechanical component that by default moves the movable cooling media panel 124 into a closed position unless overcome by an opposing force, such as a force exerted on the movable cooling media panel 124 by actuator 312. In some embodiments, actuator 312 may be an electrical, pneumatic, hydraulic or other pressure driven actuator that can be remotely controlled based on received control signals from a controller of the movable media air handling unit. For example, actuator 312 may pull movable cooling media panel 124 from a closed position to an adjusted position, such as an open position, in response to receiving control signals from a controller of the movable media air handling unit. In some embodiments, an actuator configured to pull movable cooling media panel 124 may be coordinated with another actuator element or a common actuator that also pulls open movable cooling media panel 122. Thus, movable cooling media panel 122 and movable cooling media panel 124 may be open and closed in a coordinated manner via a common actuator, in some embodiments. For example, an actuator may include a wire rope and pulley assembly that opens/closes movable cooling media panels 122 and 124 in a coordinated manner.

Figure 4A:
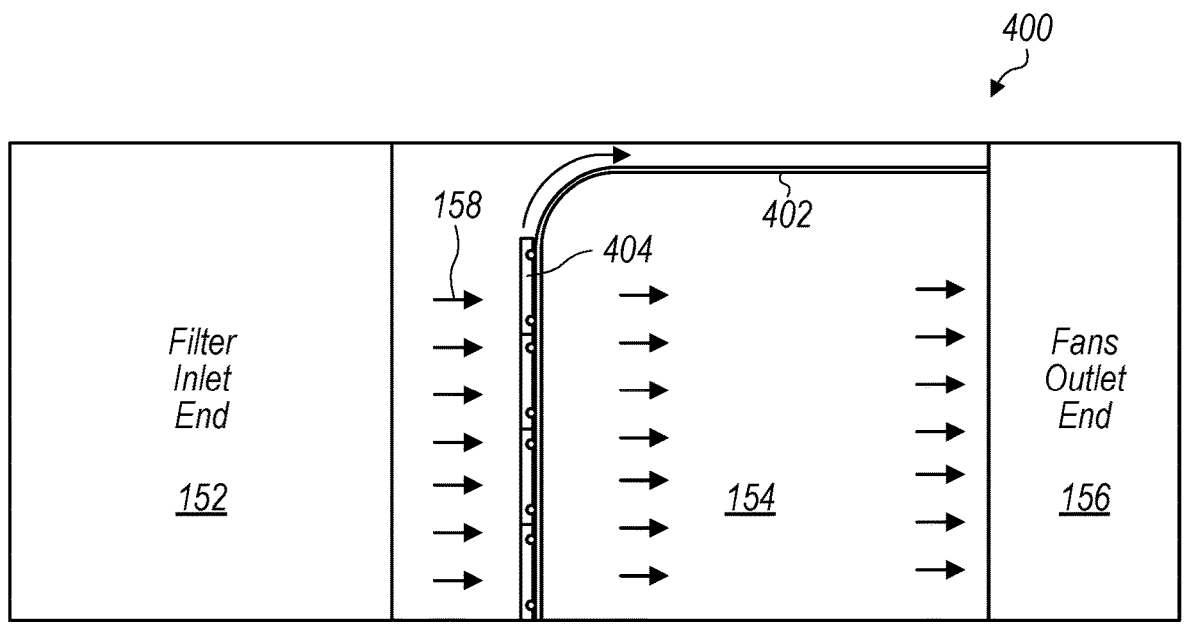
FIG. 4A illustrates a block diagram side view of a movable media air handling unit with a tracked connection connecting movable cooling media panels to a structure of the air handling unit, wherein the movable cooling media panels are in a closed position, according to some embodiments.
Figure 4B:
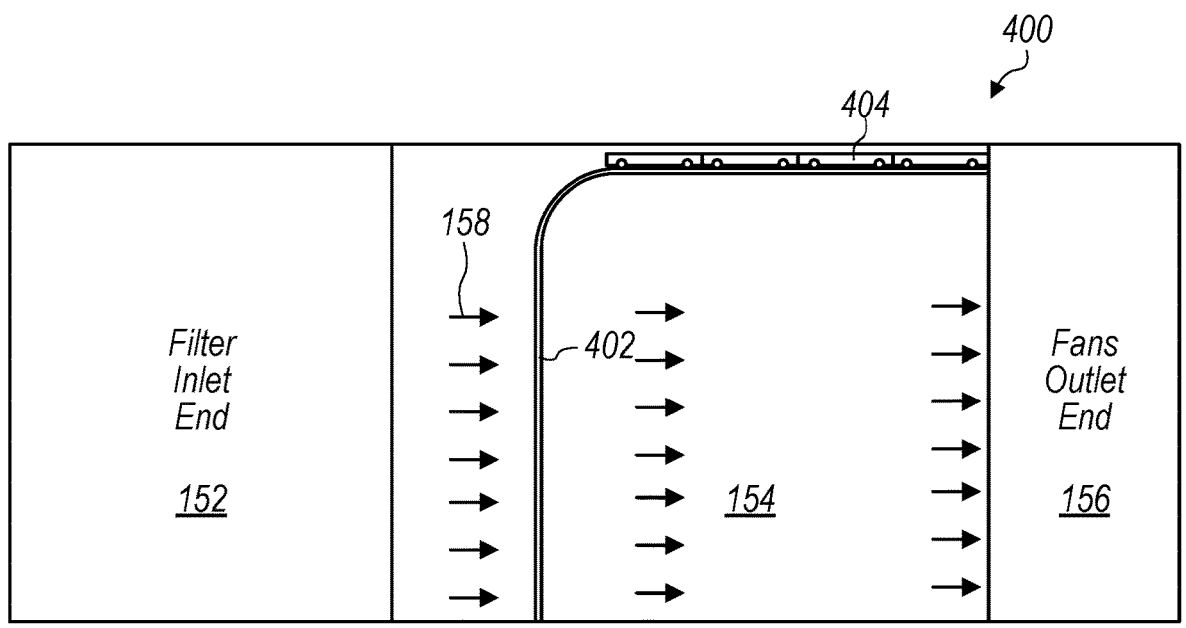
FIG. 4B illustrates a block diagram side view of a movable media air handling unit with a tracked connection connecting movable cooling media panels to a structure of the air handling unit, wherein the movable cooling media panels are in an open position, according to some embodiments.

FIG. 4A illustrates a block diagram side view of a movable media air handling unit with a tracked connection connecting movable cooling media panels to a structure of the air handling unit, wherein the movable cooling media panels are in a closed position, according to some embodiments. FIG. 4B illustrates a block diagram side view of a movable media air handling unit with a tracked connection connecting movable cooling media panels to a structure of the air handling unit, wherein the movable cooling media panels are in an open position, according to some embodiments.

In some embodiments, a movable media air handling unit may include movable cooling media panels that are coupled to a structure of the movable media air handling unit via a tracked connection.

For example, as shown in FIGS. 4A/4B in some embodiments movable cooling media panels 404 may be configured with rollers that fit within a track 402 mounted in air passageway 154 between inlet/filter end 152 and outlet/fan end 156 of a movable media air handling unit. In a closed position as shown in FIG. 4A the movable cooling media panels 404 may be rolled along the track 402 such that air of airflow 158 flowing through air passageway 154 flows through the movable cooling media panels 404. Also, in an open position as shown in FIG. 4B the movable cooling media panels 404 may be rolled along the track 402 such that the movable cooling media panels 404 are out of a path of airflow 158, such that airflow 158 flows through air passageway 154 without flowing through the movable cooling media panels 404.

While not specifically illustrated in FIGS. 4A/4B in some embodiments, movable cooling media panels mounted in a movable media air handling unit via a tracked connection may be configured to roll into a roll casing mounted out of a path of airflow 158 and unroll into a closed position. For example, instead of a track extending along a top portion of the air passageway, instead the panels may fold upon each other into a roll casing, wherein the panels can be rolled up and down.

Figure 5A:
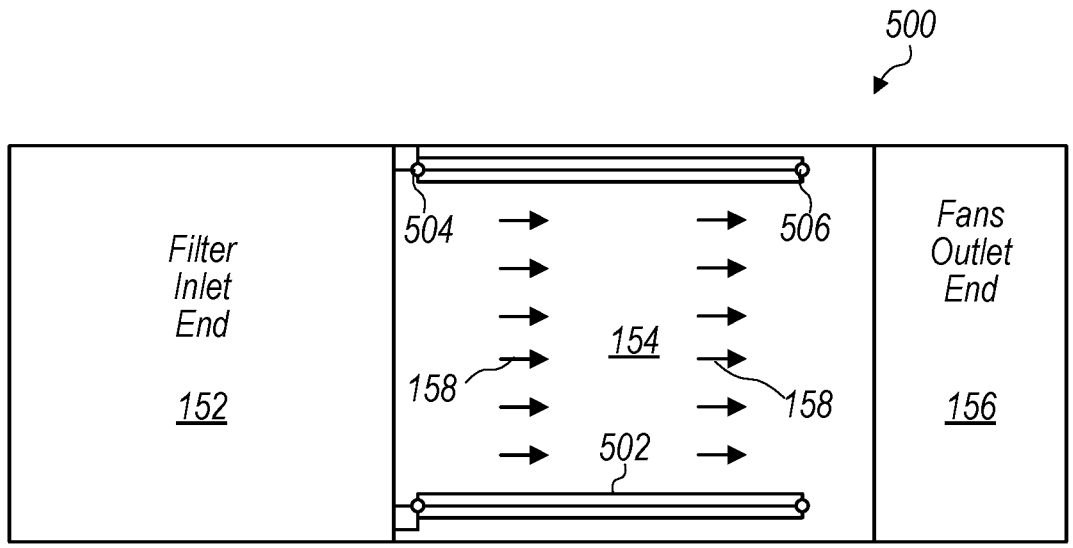
FIG. 5A illustrates a block diagram top or side view of a movable media air handling unit with split sets of movable cooling media panels coupled to opposing sides of a structure of the air handling unit, wherein the split sets of movable cooling media panels are in an open position, according to some embodiments.
Figure 5B:
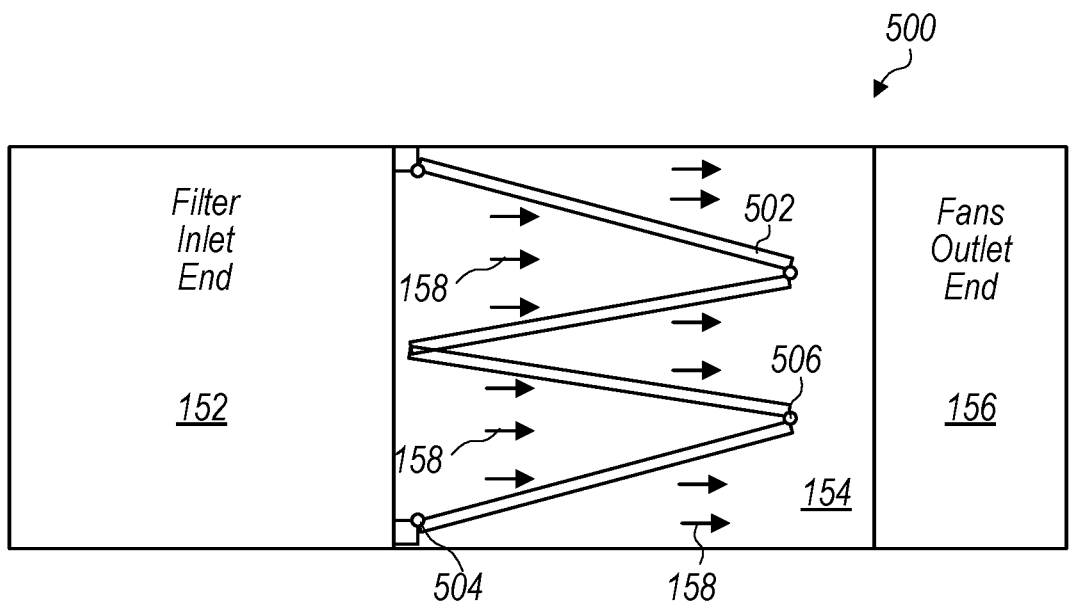
FIG. 5B illustrates a block diagram top or side view of a movable media air handling unit with split sets of movable cooling media panels coupled to opposing sides of a structure of the air handling unit, wherein the split sets of movable cooling media panels are in a closed position, according to some embodiments.

FIG. 5A illustrates a block diagram top or side view of a movable media air handling unit with split sets of movable cooling media panels coupled to opposing sides of a structure of the air handling unit, wherein the split sets of movable cooling media panels are in an open position, according to some embodiments. FIG. 5B illustrates a block diagram top or side view of a movable media air handling unit with split sets of movable cooling media panels coupled to opposing sides of a structure of the air handling unit, wherein the split sets of movable cooling media panels are in a closed position, according to some embodiments.

In some embodiments, movable cooling media panels may be coupled to opposing sides of a frame structure of a movable media air handling unit such as opposing side walls or a top and bottom wall of an air passageway of a movable media air handling unit. In some embodiments, such movable cooling media panels may be coupled to one another via hinged connections.

For example, movable cooling media panels 502 are coupled to a frame structure of movable media air handling unit 500 on opposing sides of air passageway 154. A first one of the movable cooling media panels 502 is coupled to the frame structure via a hinged connection 504 and is also coupled to an additional movable cooling media panel 502 via hinged connection 506. In an open position, as shown in FIG. 5A, the movable cooling media panels 502 may be moved out of a path of airflow 158 such that air of the airflow 158 does not flow through the movable cooling media panels 502. In a closed position, as shown in FIG. 5B, the movable cooling media panels 502 may be extended into the air passageway 154 from the opposing sides of the air passageway such that air in airflow 158 passes through the movable cooling media panels 502. Also as shown in FIGS. 5A/5B, in some embodiments, multiple movable cooling media panels may be coupled together via hinged connections such that the movable cooling media panels fold onto one another in an open position and unfold into a closed position.

Note that FIGS. 5A/5B illustrate an example arrangement of movable cooling media panels 502 that form a "W" shape when deployed into the closed position. While, not illustrated, in some embodiments other panel configurations may be used, such as a 3D shape, such as a pyramid shape, where each side of the pyramid is coupled to a different side of the air passageway 154 and the panels are configured to meet in a closed position to form the pyramid shape.

FIG. 6A illustrates a block diagram of a movable cooling media panel coupled to a structure of an air handling unit, wherein the movable cooling media panel is configured to rotate about an axis of rotation through a center or interior portion of the movable cooling media panel, according to some embodiments.

In some embodiments, a movable cooling media panel may be coupled to a structure of a movable media air handling unit such that the movable cooling media panel is configured to rotate about an axis of rotation running through a center or interior portion of the movable cooling media panel. For example, movable cooling media panel 602 is coupled to upper frame structure 604 and lower frame structure 606 via rods 608 that enable movable cooling media panel 602 to rotate about central axis of rotation 610.

In some embodiments, movable cooling media panels may be configured to move in two or more degrees of freedom. For example, in some embodiments, movable cooling media panels may be coupled in an outer movable panel structure that moves as described in FIGS. 4-5 and 7-8 and additionally allows individual panels to rotate about a central axis as shown in FIG. 6. Also, in other embodiments, center rotating panels as described in FIG. 6 may be coupled to a fixed frame structure of a movable media air handling unit instead of being coupled to outer movable frame structure.

FIG. 6B illustrates a block diagram of a cutaway view of an air passage of a movable media air handling unit comprising a set of movable cooling media panels configured for center rotation, wherein the set of movable cooling media panels are positioned in a closed position, according to some embodiments. FIG. 6C illustrates a block diagram of a cutaway view of an air passage of a movable media air handling unit comprising a set of movable cooling media panels configured for center rotation, wherein the set of movable cooling media panels are positioned in an open position, according to some embodiments.

In some embodiments center rotating panels, such as movable cooling media panels 602 may be controlled to move together as shown in FIGS. 6B and 6C, wherein the movable cooling media panels 602 are positioned in a closed arrangement in FIG. 6B and positioned in an open arrangement in FIG. 6C. Note that in the open arrangement the faces of the movable cooling media panels 602 are aligned with an air flow through an air passageway of a movable media air handling unit such that the faces are parallel to the airflow and such that the airflow flows around the movable cooling media panels 602 without flowing through the respective faces of the movable cooling media panels 602. Also, note that in the closed arrangement the faces of the movable cooling media panels 602 are aligned perpendicular to the air flow through the air passageway of the movable media air handling unit such that the air in the airflow flows through the movable cooling media panels 602.

FIG. 6D illustrates a block diagram of a cutaway view of an air passage of a movable media air handling unit comprising a set of movable cooling media panels configured for center rotation, wherein different ones of the movable cooling media panels are independently controlled and positioned in different positions, according to some embodiments.

As shown in FIG. 6D, in some embodiments, individual center rotating movable cooling media panels may be independently adjustable/controllable. For example movable cooling media panel 602A may be adjusted to a partially open/partially closed position, while movable cooling media panel 602B may be adjusted to a fully open position, and movable cooling media panel 602C may be adjusted to a fully closed position. In some embodiments, each movable cooling media panel may be associated with a corresponding actuator that is configured to receive control signals from a controller of a movable media air handling unit, wherein the control signals cause the respective actuators to adjust the respective movable cooling media panels independently.

Figure 7A:
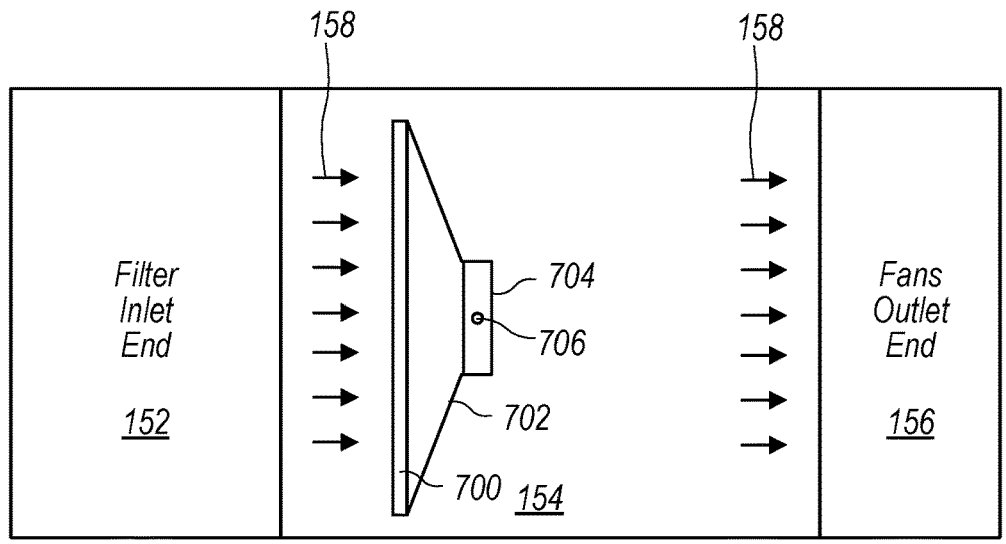
FIG. 7A illustrates a block diagram side view of a movable media air handling unit comprising a movable cooling media panel coupled to opposing sides of a structure of the air handling unit in a manner that permits tilting of the movable cooling media panel, wherein the movable cooling media panel is tilted into a closed position, according to some embodiments.
Figure 7B:
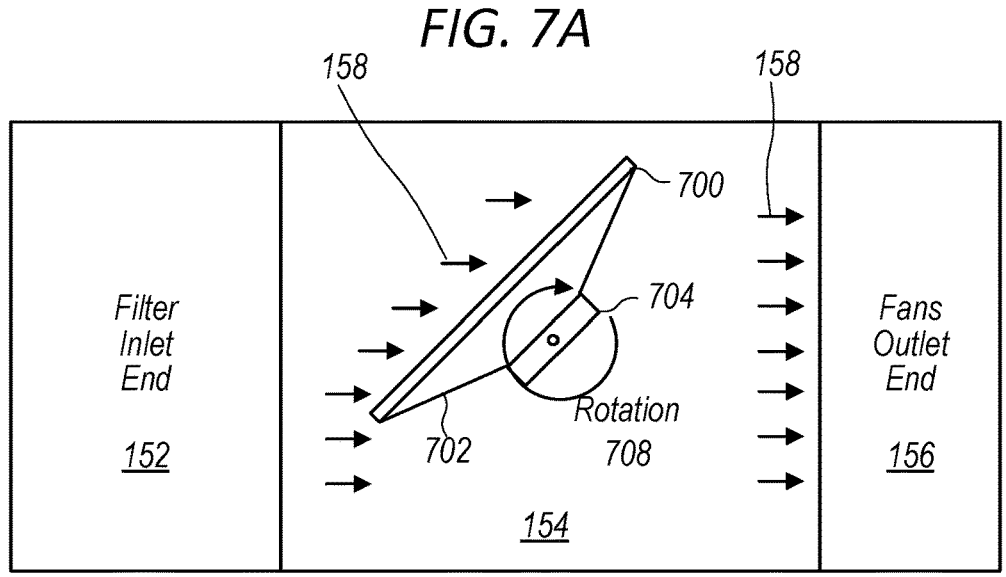
FIG. 7B illustrates a block diagram side view of a movable media air handling unit comprising a movable cooling media panel coupled to opposing sides of a structure of the air handling unit in a manner that permits tilting of the movable cooling media panel, wherein the movable cooling media panel is tilted into a partially open position, according to some embodiments.
Figure 7C:
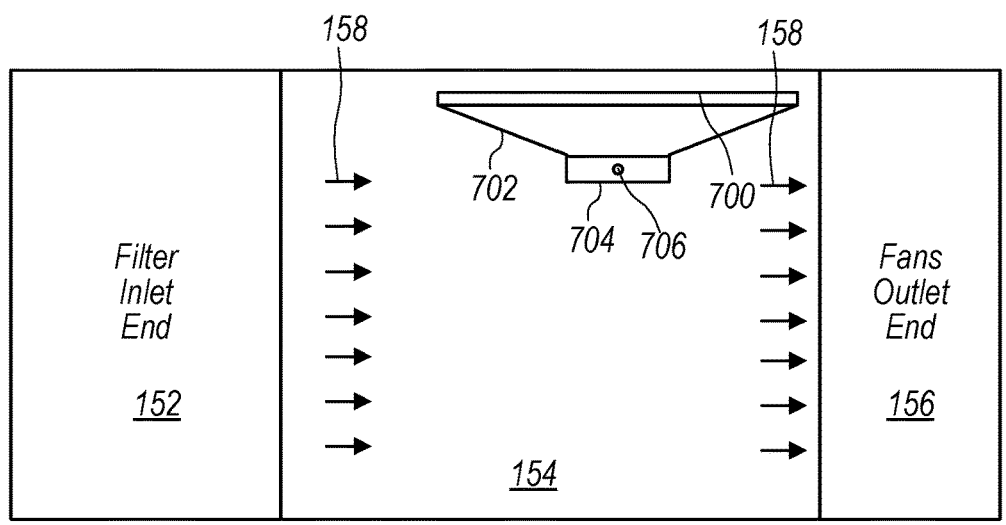
FIG. 7C illustrates a block diagram side view of a movable media air handling unit comprising a movable cooling media panel coupled to opposing sides of a structure of the air handling unit in a manner that permits tilting of the movable cooling media panel, wherein the movable cooling media panel is tilted into a fully open position, according to some embodiments.

FIGS. 7A-7C illustrate block diagram side views of a movable media air handling unit comprising a movable cooling media panel coupled to opposing sides of a structure of the air handling unit in a manner that permits tilting of the movable cooling media panel, wherein the movable cooling media panel is tilted into a closed position, a partially open position, and a fully open position, according to some embodiments.

In some embodiments, a movable cooling media panel such as movable cooling media panel 700 is coupled to a frame structure of a movable media air handling unit via swivel 706 coupled to moving frame 704 and support arms 702. In a closed position as shown in FIG. 7A airflow 158 flows through a face of movable cooling media panel 700. As shown in FIG. 7B, the movable cooling media panel 700 may be tilted back such that the moving frame 704, support arms 702 and movable cooling media panel 700 rotate about an axis of rotation 708. In a partially open position as shown in FIG. 7B some of the air in airflow 158 may pass through the movable cooling media panel 700, while another portion of the air in airflow 158 may flow around the movable cooling media panel 700 without flowing through the movable cooling media panel 700. In a fully open position, as shown in FIG. 7C, the movable cooling media panel 700, moving frame 704 and support arms 702 may be further tilted back such that the movable cooling media panel 700 is out of a path of airflow 158 such that the air of airflow 158 does not flow through the movable cooling media panel 700. Also, as mentioned above, in some embodiments, support arms 702 may support an outer frame structure and a plurality of center axis rotating panels may be included in a titling frame arrangement. In such embodiments, individual movable cooling media panels may be adjusted in two or more degrees of freedom, such as a tilt angle and a center rotation angle.

FIG. 8A illustrates a block diagram top or side view of a movable media air handling unit with movable cooling media panels arranged in a "V" shape arrangement, according to some embodiments.

For example, movable cooling media panels 802 and 804 are in a closed position that forms a "V" shape in air passageway 154.

FIG. 8B illustrates a block diagram top or side view of a movable media air handling unit with movable cooling media panels arranged in a "W" shape arrangement, wherein the respective movable cooling media panels are configured for hinged side rotation, according to some embodiments.

For example, movable cooling media panels 810 are coupled together via hinged connections 812 to form a "W" shape arrangement when in the closed position.

FIG. 8C illustrates another block diagram top or side view of a movable media air handling unit with movable cooling media panels arranged in a "W" shape arrangement, wherein the respective movable cooling media panels are configured for center rotation, according to some embodiments.

For example, movable cooling media panels 820 are individually coupled to a frame structure via center rotation connectors 822 and form a "W" shape arrangement when in the closed position.

In some embodiments, movable cooling media panels, as described herein, may include various types of cooling media, such as chilled liquid coils, compressed refrigerant cools, evaporative cooling banks, etc.

FIG. 9A illustrates an example movable cooling media panel comprising chilled liquid cooling coils and a chilled liquid flexible connection for the chilled liquid cooling coils, according to some embodiments.

In some embodiments, a movable cooling media panel of a movable media air handling unit may include chilled liquid coils. For example chilled liquid movable cooling media panel 902 includes liquid coils 904 and hose connectors that couple with flexible hoses 906 and 908. In some embodiments a rubber hose or other flexible conduit may be used to connect an inlet and an outlet of a chilled liquid movable cooling media panel 902 to a chilled liquid source and a chilled liquid return line. The flexible hoses or other flexible conduit may enable the panel to rotate while connected to non-rotating fixed chilled liquid supply and return lines.

FIG. 9B illustrates an example movable cooling media panel comprising compressed refrigerant cooling coils and a rotating connector block for the chilled refrigerant cooling coils, according to some embodiments.

In some embodiments, a movable cooling media panel of a movable media air handling unit may include compressed refrigerant coils in which the refrigerant expands to remove heat from air passing over the coils. For example compressed refrigerant movable cooling media panel 910 includes refrigerant coils 912 and rotating connection block 914 that couples with supply and return lines 916 and 918. In some embodiments a rotating connection block 914 may include a rotating seal arrangement that contains flowing compressed refrigerants while enabling rotation. In some embodiments, a movable media air handling unit may include a compressor, and supply and return lines 916 and 918 may supply compressed refrigerant from the compressor and may return expanded refrigerant back to the compressor.

FIG. 9C illustrates an example movable cooling media panel comprising evaporative cooling media sections and a flexible connection for supplying fluid to the evaporative cooling media sections and draining excess fluid from the evaporative cooling media sections, according to some embodiments.

In some embodiments, a movable cooling media panel of a movable media air handling unit may include one or more evaporative cooling media banks that are mounted in a frame of the movable cooling media panel. For example evaporative cooling media panel 920 includes evaporative cooling media banks 922, water supply lines 924, and sump 926. Additionally, hose connectors couple to flexible hoses 928 and 930 that supply water to the evaporative cooling media banks 922 and return excess water from the sump 926. The flexible hoses or another flexible conduit may enable the panel to rotate while connected to non-rotating fixed water supply and return lines.

Figure 10A:
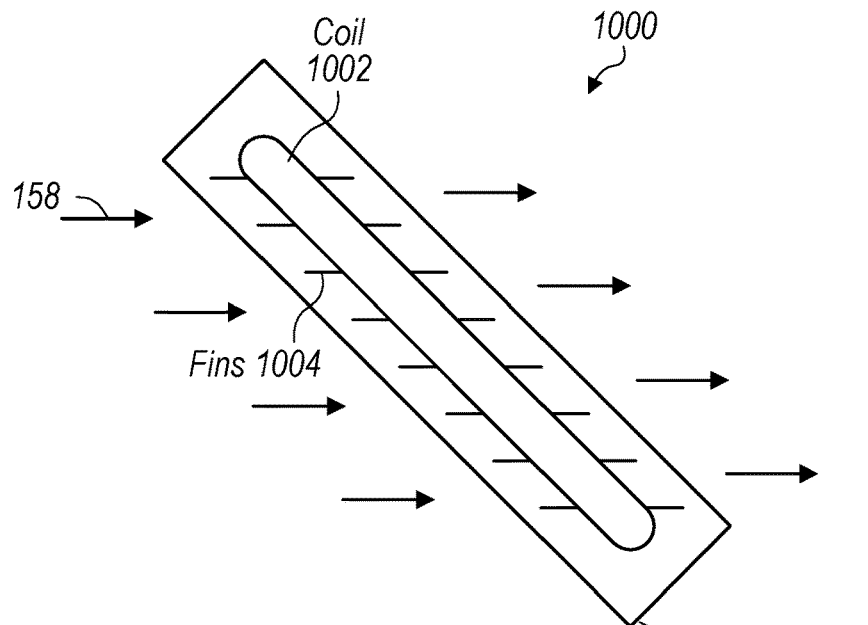
FIG. 10A illustrates a cut-away view of a coil of a movable cooling media panel, wherein fins are coupled to the coil and oriented in-line with an airflow through the movable cooling media panel when the movable cooling media panel is oriented in a closed position, according to some embodiments.

FIG. 10A illustrates a cut-away view of a coil of a movable cooling media panel, wherein fins are coupled to the coil and oriented in-line with an airflow through the movable cooling media panel when the movable cooling media panel is oriented in a closed position, according to some embodiments.

In some embodiments, movable cooling media panels comprising coils, such as coils 904 or 912 may include fins that are configured to align with an air flow direction of an airflow through an air passageway of a movable media air handling unit, when the movable cooling media panel is in a closed position.

For example, movable cooling media panel 1000 includes coil 1002 with fins 1004 that are aligned with airflow 158.

Figure 10B:
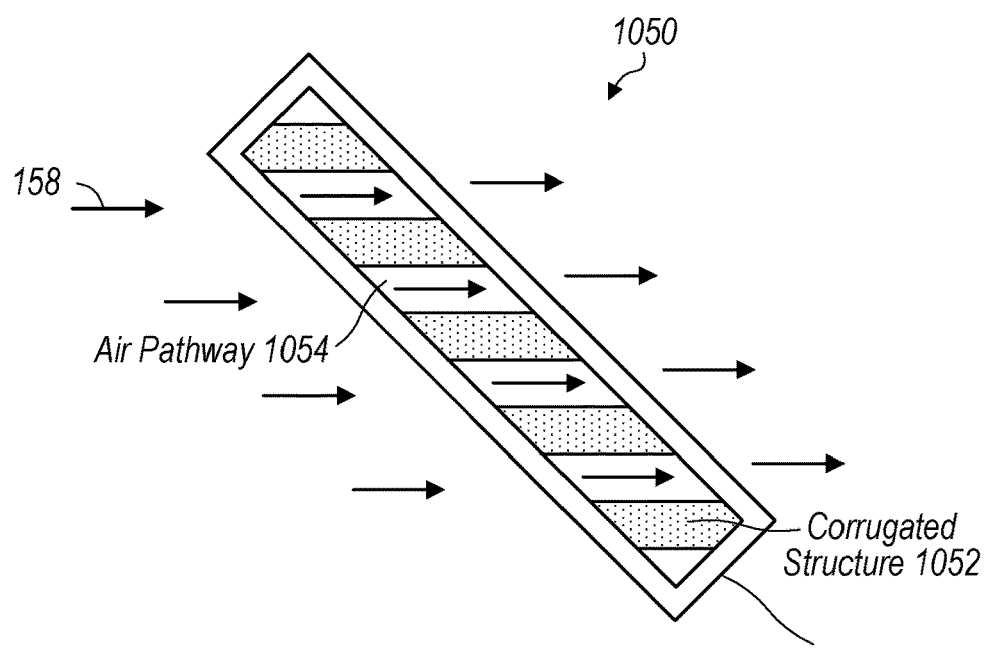
FIG. 10B illustrates a cut-away view of a substrate of an evaporative cooling media section that includes air openings that are oriented in-line with an airflow through the evaporative cooling media section when a movable cooling media panel comprising the evaporative cooling media section is oriented in a closed position, according to some embodiments.

FIG. 10B illustrates a cut-away view of a substrate of an evaporative cooling media section that includes air openings that are oriented in-line with an airflow through the evaporative cooling media section when a movable cooling media panel comprising the evaporative cooling media section is oriented in a closed position, according to some embodiments.

For example, movable cooling media panel 1050 includes a corrugated structure 1052 that includes air pathways 1054 that are aligned with airflow 158.

In some embodiments, such as in a "V" shaped arrangement the fins 1004 or the air pathways 1054 may be oriented at a 45 degree angle. In other embodiments, such as in a "W" arrangement the fins 1004 or the air pathways 1054 may be oriented at a slightly different angle depending on the slope of the panels that make up the "W" arrangement.

Figure 11:
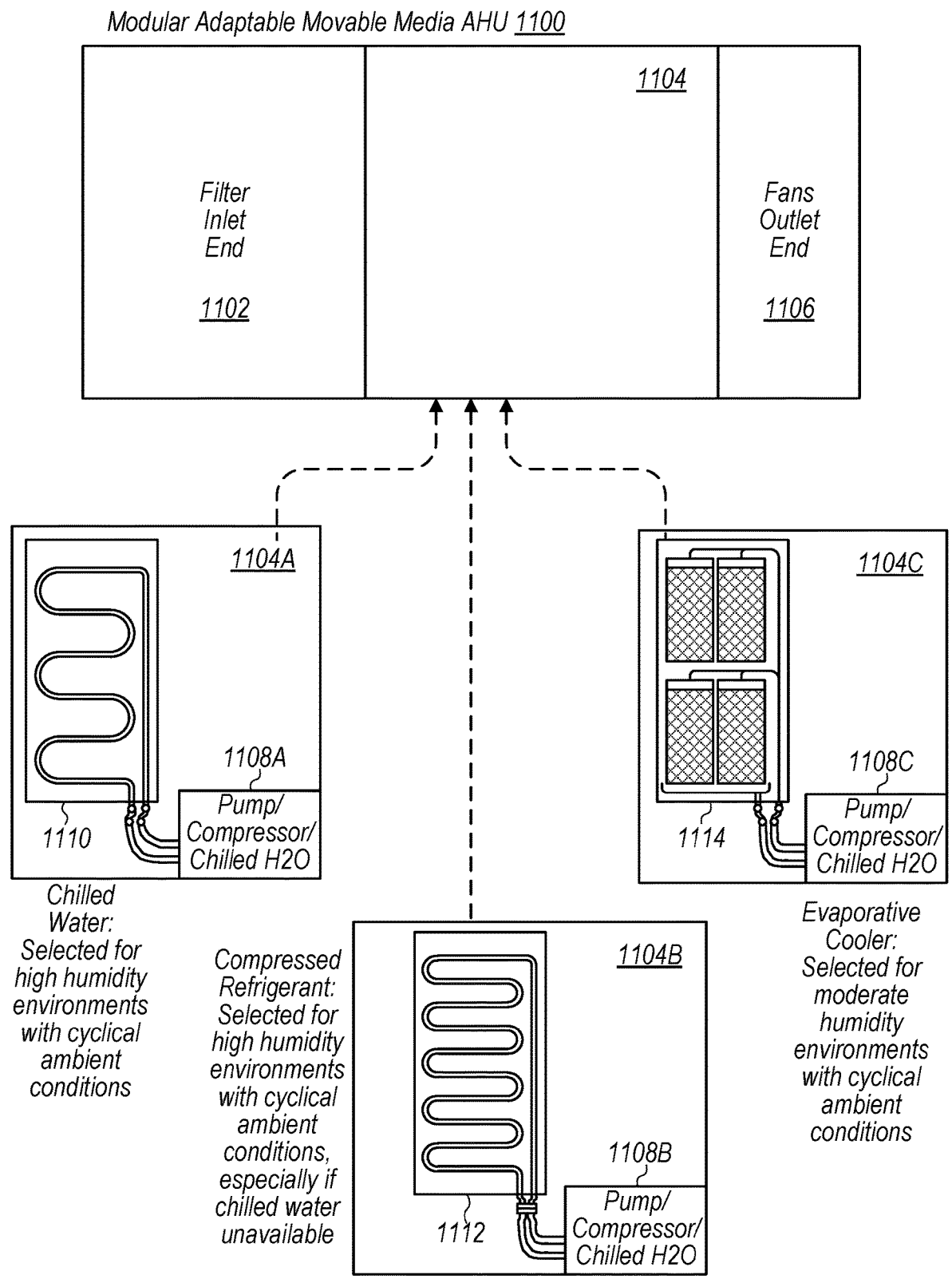
FIG. 11 illustrates a modular movable media air handling unit structure configured to accept any of a plurality of types of movable cooling media panels based on environmental conditions of a location at which the modular movable media air handling unit will be deployed, according to some embodiments.

FIG. 11 illustrates a modular movable media air handling unit structure configured to accept any of a plurality of types of movable cooling media panels based on environmental conditions of a location at which the modular movable media air handling unit will be deployed, according to some embodiments.

In some embodiments, a movable media air handling unit may have a modular design. For example the modular air handling unit may be pre-fabricated without including movable cooling media panels in the air passageway of the modulator movable media air handling unit. Instead the modular movable media air handling unit may include an open space configured to accept a pre-fabricated air passageway comprising any of a plurality of different types of movable cooling media panels. For example, if the modular movable cooling unit is to be deployed to a data center with a chilled water distribution system and that is located in a location with cyclical high humidity, a modular air passageway with chilled liquid movable cooling media panels may be installed in the modular movable media air handling unit. Alternatively, if the same pre-fabricated modular movable air handling unit is to be deployed to a data center that does not have a chilled water system, a modular air passageway with compressed refrigerant movable cooling media panels may be installed in the modular movable media air handling unit. As yet another option, if the modular air handing unit is to be deployed to a location with low humidity but cyclical temperatures, a modular air passageway with an evaporative cooling movable cooling media panel may be installed in it.

For example, modular movable media air handling unit 1100 includes filter inlet end 1102 and fans outlet end 1106, but in contrast to other ones of the movable media air handling units previously described, air passageway space 1104 may be empty. However, the air passageway space 1104 may be configured to accept any of modular air passageways 1104A, 1104B or 1104C comprising movable cooling media panels 1110, 1112, or 1114.

In some embodiments, the modular air passageways 1104A, 1104B, or 1104C may further include a pump/compressor, chilled water manifold compartment, such compartments 1108A, 1108B, or 1108C. In such embodiments, a modular compressor, pump, or manifold may be installed in the compartment 1108A, B, or C that corresponds to a type of cooling media panel installed in the air passageway 1104A, B, or C.

Figure 12A:
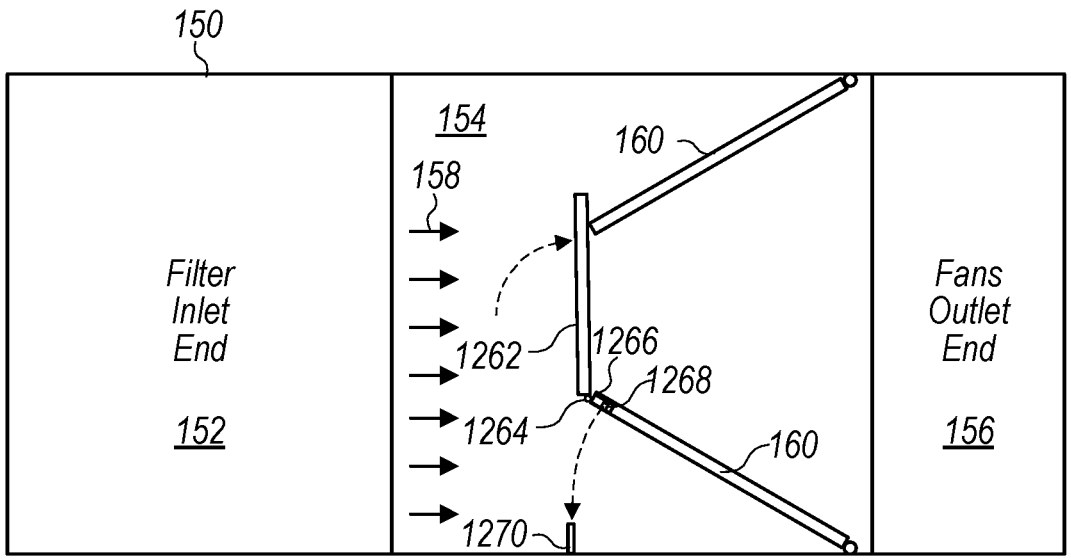
FIG. 12A illustrates a top view of an air passage of a movable media air handling unit that includes a transition piece coupled to one or more of the movable cooling media panels, wherein the movable cooling media panels are in a partially open position, according to some embodiments.

FIG. 12A illustrates a top view of an air passage of a movable media air handling unit that includes a transition piece coupled to one or more of the movable cooling media panels, wherein the movable cooling media panels are in a partially open position, according to some embodiments.

Figure 12B:
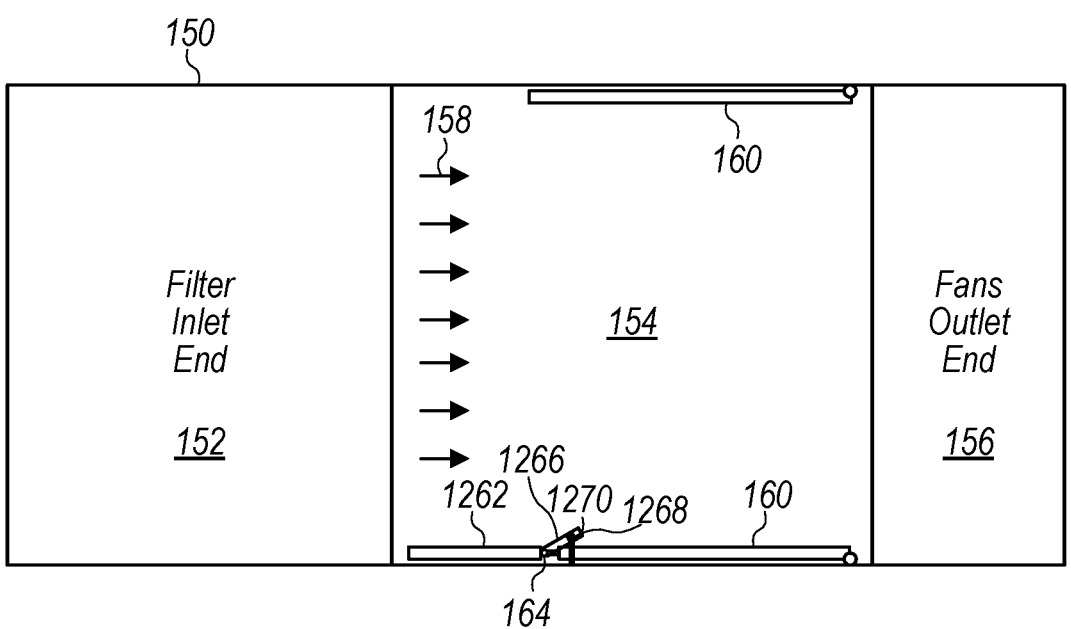
FIG. 12B illustrates a top view of an air passage of a movable media air handling unit that includes a transition piece coupled to one or more of the movable cooling media panels, wherein the movable cooling media panels are in a fully open position, according to some embodiments.

FIG. 12B illustrates a top view of an air passage of a movable media air handling unit that includes a transition piece coupled to one or more of the movable cooling media panels, wherein the movable cooling media panels are in a fully open position, according to some embodiments.

Figure 12C:
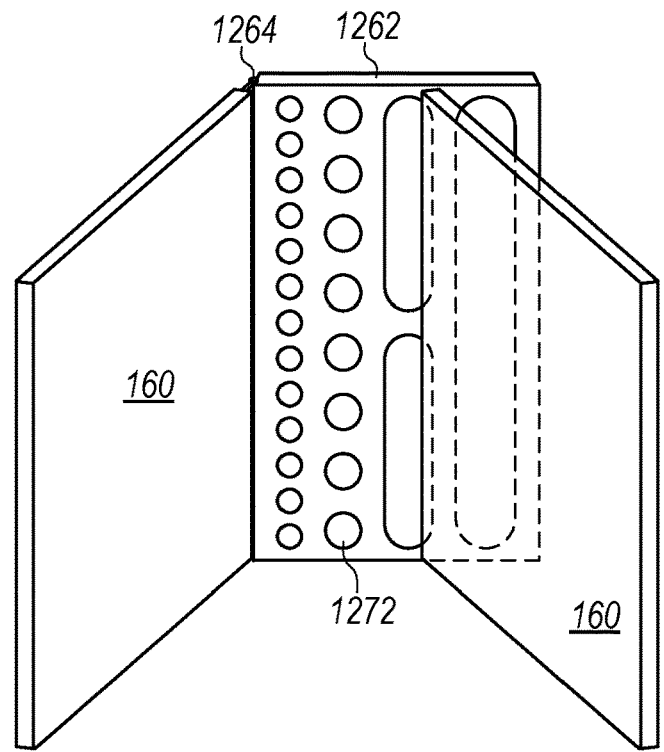
FIG. 12C illustrates a front view of a cutaway of an air passage of a movable media air handling unit showing a transition piece between partially open movable cooling media panels, according to some embodiments.

In some embodiments, a transition piece may be coupled to one or more of the movable cooling media panels, such that air flow through the air passageway of a movable media air handling unit remains distributed somewhat evenly through the air passageway as the movable cooling media banks transition from a closed position to an open position, or vice versa. As shown in FIG. 12C/12D, in some embodiments a transition piece may include openings with increasing cross sectional area such that flow restrictions through the transition piece are smoothly reduced as the movable cooling media panels separate from one another as they open and smoothly increased as they close.

For example, movable media air handling unit 150 includes transition piece 1262 coupled to one of movable cooling media panels 160 via a spring loaded hinge 1264. Transition piece 1262 is also coupled to lever 1266 that includes notch 1268 that engages with peg 1270 when the movable cooling media panel 160 is in the open position. The engagement of notch 1268 with peg 1270 causes lever 1266 to push transition piece 1262 out of airflow path 158.

FIG. 12C illustrates a front view of a cutaway of an air passage of a movable media air handling unit showing a transition piece between partially open movable cooling media panels, according to some embodiments.

Figure 12D:
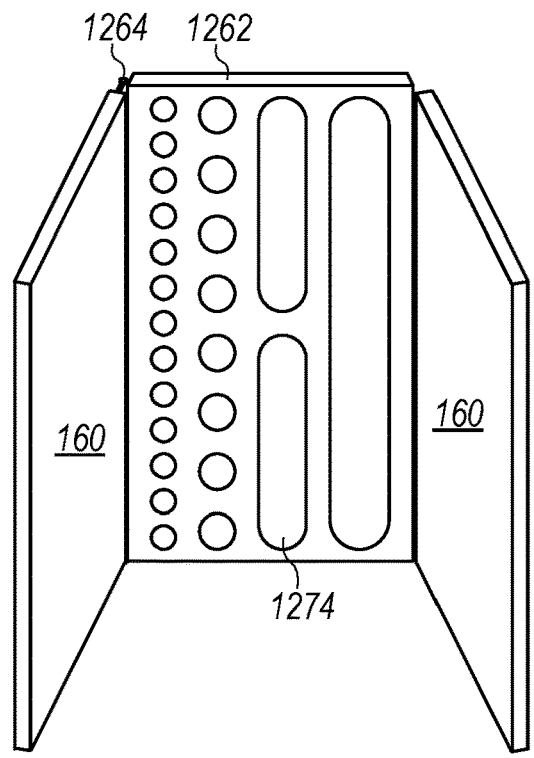
FIG. 12D illustrates a front view of a cutaway of an air passage of a movable media air handling unit showing a transition piece between movable cooling media panels that have further partially opened, according to some embodiments.

FIG. 12D illustrates a front view of a cutaway of an air passage of a movable media air handling unit showing a transition piece between movable cooling media panels that have further partially opened, according to some embodiments.

As shown in FIGS. 12C/D spring loaded hinge 1264 causes transition piece 1262 to engage with a back side of an opposing movable cooling media panel 160 as the movable cooling media panels move relative to one another. Also, transition piece 1264 includes openings that increase in cross sectional area as the panels separate. For example opening 1274 has a greater cross sectional area than opening 1272. The gradual increasing cross sectional area of the openings may smooth a transition from closed to open, such that airflow through an air passage transitions from flowing through the movable cooling media panels to flowing around the movable cooling media panels. This may avoid humidity spikes that may result in a rapid transition from no evaporative cooling to evaporative cooling or vice versa. For example transition piece 1262 may also smooth a transition from an open configuration to a closed configuration as well as from a closed configuration to an open configuration.

Figure 13:
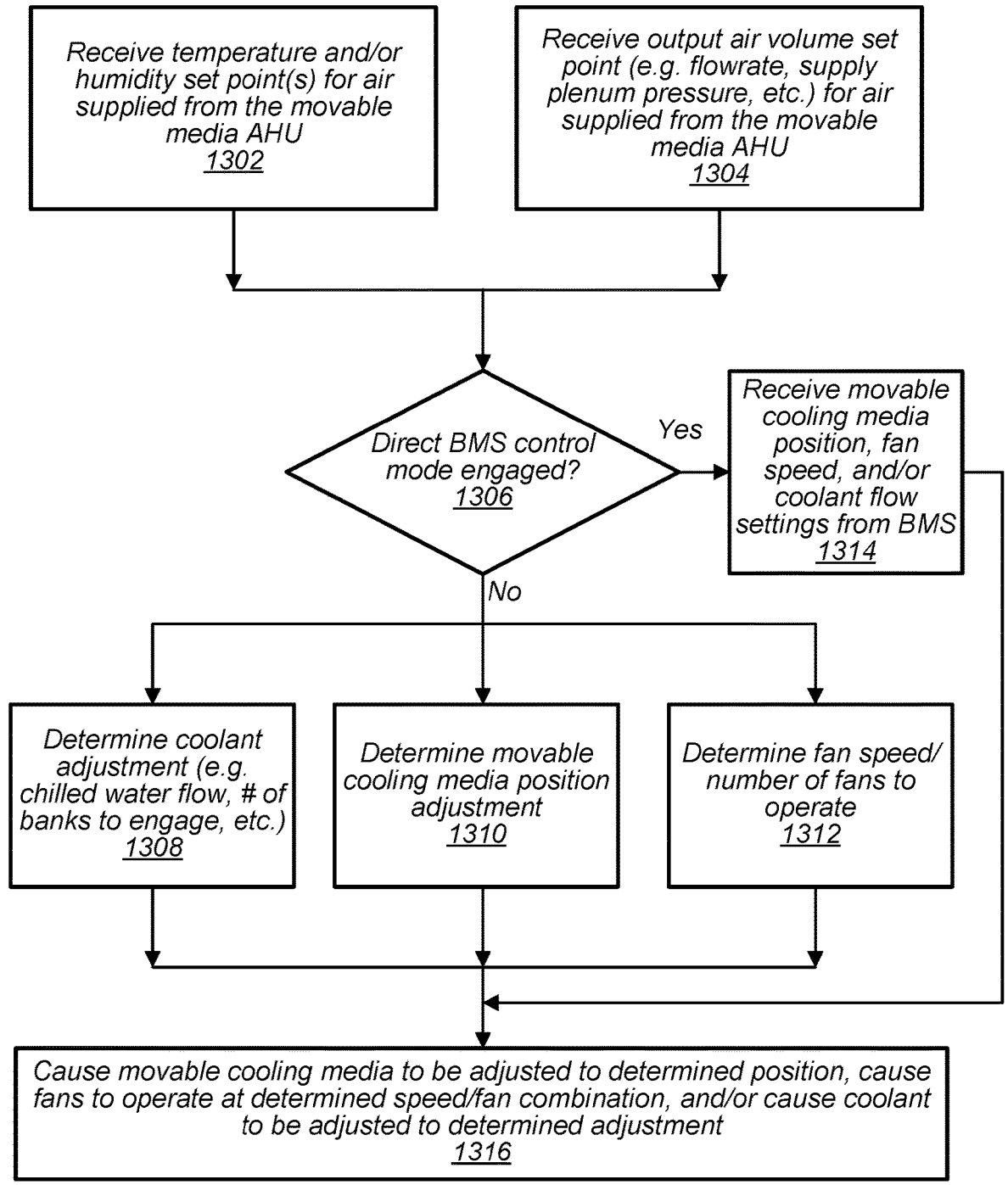
FIG. 13 illustrates an example process of controlling a movable media air handling unit, according to some embodiments.

FIG. 13 illustrates an example process of controlling a movable media air handling unit, according to some embodiments.

At 1302 a controller for a movable media air handling unit receives temperature and/or humidity set points for air supplied from the movable media air handling unit.

At 1304, the controller receives an output air volume set point, such as a flow rate of air to be supplied or a supply plenum pressure to be maintained. In some embodiments, the set points received at 1302 and 1304 may be received from an operator of a facility or may be received from a building management system (BMS) of the facility. For example, an operator may update control code for the movable media air handling unit to include the set points, the operator may adjust set points of the movable media air handling unit via a user interface, or a building management system may provide set points via a network connection to the controller. In some embodiment other methods may be used to adjust set points.

Also, in some embodiments, direct BMS control may be engaged. If it is determined at 1306 that direct BMS control is engaged, at 1314 the BMS may provide a movable cooling media panel position that the movable cooling media panels of the movable media air handling unit are to be adjusted to. The BMS may also provide a fan speed and/or coolant flow settings for a coolant to be supplied to a movable cooling media panel, such as chilled liquid flow or refrigerant flow.

If it is determined at 1306 that direct BMS control is not engaged or that communication with a BMS system is lost, the controller of the movable media air handling unit may determine at 1308, a coolant adjustment, determine at 1310 a movable cooling media position adjustment, and determine at 1312 a fan speed adjustment or a number of fans of a fan bank to operate.

At 1316, the controller then issues control signals to an actuator to cause the movable cooling media panel to be adjusted to the received or determined position adjustment. Also the controller issues control commands to control the fans at the determined or received fan speed, and also causes coolant adjustments to be made based on determined or received coolant adjustments.

In some embodiments, a controller may receive regular set points updates, for example from a BMS, and may execute the steps of FIG. 13 in response to each new set point update.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
rack-mounted computer systems mounted in respective computer rooms of the data center; and
an air handling unit configured to supply cooling air to one or more of the computer rooms of the data center, wherein the air handling unit comprises:
a frame structure forming an air passage through the air handing unit;
one or more fans configured to induce air flow through the air passage; and
two or more movable cooling media panels coupled to the frame structure between an inlet end of the air passage and an outlet end of the air passage,
wherein individual ones of the two or more movable cooling media panels are coupled to the frame structure such that individual ones of the two or more movable cooling media panels are configured to be moved in the air passage between:
a closed position, wherein the two or more movable cooling media panels are positioned in the air passage such that the induced air flow through the air passage flows through the two or more movable cooling media panels; and
an open position, wherein the two or more movable cooling media panels are positioned in the air passage such that at least a portion of the induced air flow through the air passage flows through the air passage without flowing through the movable cooling media panels.

2. The data center of claim 1, wherein individual ones of the two or more movable cooling media panels are coupled to the frame structure of the air handling unit via a hinged connection that permits rotation of the individual movable cooling media panel in the air passage about an axis of rotation of the hinged connection.

3. The data center of claim 1, wherein individual ones of the two or more movable cooling media panels are coupled to the frame structure of the air handling unit via a track connection that permits the individual movable cooling media panel to move into and out of the induced air flow via movement along a track.

4. The data center of claim 1,
wherein the two or more movable cooling media panels are coupled in the air passage such that the two or more movable cooling media panels:
form a "V" shaped cooling media bank in a path of the air flow through the air passage when in the closed position; and
move primarily out of the path of the air flow through the air passage when in the open position.

5. The data center of claim 1, further comprising:
two or more additional movable cooling media panels coupled to the frame structure between the inlet end of the air passage and the outlet end of the air passage,
wherein the two or more movable cooling media panels and the two or more additional movable cooling media panels are coupled in the air passage such that the two or more movable cooling media panels and the two or more additional movable cooling media panels:
form a "W" shaped or a pyramid shaped cooling media bank in a path of the air flow through the air passage when in the closed position; and
move primarily out of the path of the air flow through the air passage when in the open position.

6. The data center of claim 1, wherein the two or more movable cooling media panels comprise one or more of:
cooling coils configured to circulate a liquid cooling fluid to remove heat from air in the air flow through the air passage;
cooling coils configured to circulate an expanding compressed refrigerant to remove heat from air in the air flow through the air passage; or
an evaporative cooling media panel configured to directly evaporate liquid into the air flow through the air passage to remove heat from air in the air flow through the air passage.

7. The data center of claim 6, wherein the two or more movable cooling media panels further comprise:
fins coupled to the cooling coils, wherein the fins are oriented at an angle such that the fins are aligned with the air flow through the air passage when an individual one of the two or more moveable cooling media panels is in the closed position; or
openings in the evaporative cooling media panel that are oriented at an angle such that the openings are aligned with the air flow through the air passage when an individual one of the two or more moveable cooling media panels is in the closed position.

8. An air handling unit, comprising:
a structure forming an air passage through the air handing unit;
one or more fans configured to induce air flow through the air passage; and
two or more movable cooling media panels coupled to the structure of the air handling unit between an inlet end of the air passage and an outlet end of the air passage,
wherein the two or more movable cooling media panels are coupled to the structure of the air handling unit such that the two or more movable cooling media panels are configured to be moved in the air passage between two or more positions comprising at least:
a first position, wherein the two or more movable cooling media panels are positioned in the air passage such that the induced air flow through the air passage flows through the two or more movable cooling media panels; and
another position, wherein the two or more movable cooling media panels are positioned in the air passage such that at least a portion of the induced air flow through the air passage flows through the air passage without flowing through the two or more movable cooling media panels.

9. The air handling unit of claim 8, wherein the air passage and the two or more movable cooling media panels are part of a modular air passage,
wherein the air handing unit is configured to:
accept installation of different types of modular air passages comprising different types of movable cooling media panels, wherein a particular modular air passage comprising a particular movable cooling media panel is selected to be installed in the air handling unit based on environmental conditions at a location where the air handling unit is to be deployed, wherein the different types of modular air passages comprising different types of movable cooling media panels include:
- a modular air passage comprising cooling coils configured to circulate a liquid cooling fluid to remove heat from air in the air flow through the air passage;
- a modular air passage comprising cooling coils configured to circulate an expanding compressed refrigerant to remove heat from air in the air flow through the air passage; or
- a modular air passage comprising an evaporative cooling media panel configured to directly evaporate liquid into the air flow through the air passage to remove heat from air in the air flow through the air passage.

10. The air handling unit of claim 8, further comprising:
a hinged connector, wherein at least an individual one of the two or more movable cooling media panels is coupled to the structure of the air handling unit via the hinged connector such that the individual movable cooling media panel is configured to rotate in the air passage.

11. The air handling unit of claim 8, wherein the two or more movable cooling media panels are coupled to the structure such that the two or more movable cooling media panels are configured to move in two or more degrees of freedom.

12. The air handling unit of claim 8, wherein the two or more movable cooling media panels are coupled to the structure of the air handling unit via respective top and bottom connectors or via respective side connectors such that the two or more movable cooling media panels are configured to:
- rotate into a closed position such that respective faces of the two or more movable cooling media panels are aligned perpendicular to the air flow through the air passage; and
- rotate into an open position such that the respective faces of the two or more movable cooling media panels are oriented parallel to the air flow through the air passage, wherein the air flow flows between open spaces in the air passage between the two or more movable cooling media panels rotated into the open position.

13. The air handling unit of claim 8, wherein the two or more movable cooling media panels are coupled to opposing sides of the structure of the air handling unit such that the two or more movable cooling media panels are configured to:
- unfold into a closed position such that the two or more movable cooling media panels are positioned in the air flow through the air passage; and
- fold toward the opposing sides of the structure into an open position such that the two or more movable cooling media panels are positioned primarily outside of the air flow through the air passage.

14. The air handling unit of claim 8, wherein the two or more movable cooling media panels are coupled to one or more sides of the structure of the air handling unit such that the two or more movable cooling media panels are configured to:
- unroll into a closed position such that the two or more movable cooling media panels are positioned in the air flow through the air passage; and
- roll back into an open position such that the two or more movable cooling media panels are positioned primarily outside of the air flow through the air passage.

15. The air handling unit of claim 8, further comprising:
an air flow transition piece coupled to a given one of the two or more movable cooling media panels, wherein the air flow transition piece comprises openings that progressively increase in cross-sectional area in a direction away from the given movable cooling media panel to which the air flow transition piece is coupled,
wherein the air flow transition piece is coupled to the given movable cooling media panel such that the air flow transition piece moves with the given movable cooling media panel and such that the air flow transition piece progressively reduces air flow resistance experienced by the air flow through the air passage as the given movable cooling media panel moves from a closed position to an open position.

16. The air handling unit of claim 8, further comprising:
a process logic controller configured to:
cause a position of one or more of the two or more movable cooling media panels to be adjusted based on a measured temperature or humidity of air being supplied from the air handling unit.

17. The air handling unit of claim 16, wherein the process logic controller is further configured to:
receive, from a building management system (BMS) of a data center, a temperature or humidity set point for air supplied from the air handling unit;
receive, from the BMS, an air flow rate set point or a supply plenum air pressure set point for the air supplied from the air handling unit; and
determine a combination of movable cooling media panel position and fan speed for the one or more fans that cause the temperature or humidity set point and the air flow rate set point or the supply plenum air pressure set point for the air supplied from the air handling unit to be met.

18. The air handling unit of claim 17, wherein the process logic controller is further configured to:
receive from the BMS a determined position for the two or more movable cooling media panels;
receive from the BMS a determined fan speed for the one or more fans;
cause the two or more movable cooling media panels to be adjusted to the determined position; and
cause the one or more fans to be adjusted to the determined fan speed.

19. The air handling unit of claim 16, further comprising:
an actuator assembly configured to move at least an individual one of the two or more movable cooling media panels in response to control signals received from the process logic controller, wherein the actuator assembly comprises:
- a mechanical component configured to move the at least one movable cooling media panel into a closed position unless overcome by an opposing force; and
- a pneumatic, hydraulic, or electric component configured to provide the opposing force to move the at least one movable cooling media panel into an at least partially open position based on the control signals received from the process logic controller.

20. One or more non-transitory, computer-readable storage media, storing program instructions that when executed on or across one or more computing devices cause the one or more computing devices to implement a controller for a movable media air handling unit, wherein the controller is configured to:
  determine a position adjustment of two or more movable cooling media panels in an air passage of the movable media air handling unit; and
  cause the two or more movable cooling media panels of the movable media air handling unit to be adjusted between a closed position where the two or more movable cooling media panels are positioned in an air flow through the air passage and an open position where the two or more movable cooling media panels are positioned at least partially out of the airflow through the air passage, based on the determined position adjustment.

* * * * *